(12) United States Patent
Noguchi

(10) Patent No.: US 6,285,041 B1
(45) Date of Patent: *Sep. 4, 2001

(54) THIN-FILM TRANSISTOR HAVING A HIGH RESISTANCE BACK CHANNEL REGION AM) FABRICATION METHOD THEREOF

(75) Inventor: Kesao Noguchi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/921,044

(22) Filed: Aug. 29, 1997

(30) Foreign Application Priority Data

Aug. 29, 1996 (JP) .................................................. 8-228733

(51) Int. Cl.⁷ ........................... H01L 29/04; H01L 31/20; H01L 31/036; H01L 31/0376
(52) U.S. Cl. ................................ 257/61; 257/59; 257/72; 257/350
(58) Field of Search ................................. 257/59, 61, 72, 257/350, 352

(56) References Cited

U.S. PATENT DOCUMENTS

| | | | |
|---|---|---|---|
| 5,045,905 | * | 9/1991 | Motai et al. . |
| 5,150,181 | * | 9/1992 | Takeda et al. . |
| 5,289,016 | | 2/1994 | Noguchi ................................ 257/57 |

FOREIGN PATENT DOCUMENTS

| | | |
|---|---|---|
| 0 361 609 | 4/1990 | (EP) . |
| 59-172774 | 9/1984 | (JP) . |
| 1-275767 | 11/1989 | (JP) . |
| 1276767 | 11/1989 | (JP) . |
| 1-302769 | 12/1989 | (JP) . |
| 2-116173 | 4/1990 | (JP) . |
| 2-168630 | 6/1990 | (JP) . |
| 46878 | 1/1992 | (JP) . |
| 622244 | 3/1994 | (JP) . |
| 7263702 | 10/1995 | (JP) . |

OTHER PUBLICATIONS

IEEE Electron Device Letters. vol. 9, No. 2, written by A. Yoshida, K. Setsune, and T. Hirano "Formation of Source and Drain Regions for a–Si:H Thin–Film Transistors by Low–Energy Ion Doping Technique," published Feb., 1988.

* cited by examiner

Primary Examiner—Ngân V. Ngô
(74) Attorney, Agent, or Firm—Sughrue, Mion Zinn, Macpeak & Seas, PLLC

(57) ABSTRACT

A thin-film transistor is provided, which has a simple configuration and improved off-characteristic, operational reliability, and fabrication yield. This transistor includes a substrate and a layered structure formed on the substrate. The layered structure includes a semiconductor film, a gate insulating film located on a first side of the semiconductor film to be overlapped with the semiconductor film, a gate electrode located on the gate insulating film on the first side of the semiconductor film to be selectively overlapped with the semiconductor film, a source electrode located on a second side of the semiconductor film to be electrically connected to the semiconductor film, and a drain electrode located on the second side of the semiconductor film to be electrically connected to the semiconductor film and to be apart from the source electrode. The semiconductor film has a back channel section between opposite ends of the source and drain regions. The back channel section includes a high-resistance part generated by doping n- and p-type impurities.

8 Claims, 15 Drawing Sheets

THIN-FILM TRANSISTOR HAVING A HIGH RESISTANCE BACK CHANNEL REGION AM) FABRICATION METHOD THEREOF

BACKGROUND OF THE INVENTION

1. Field of the Invention

The present invention relates to a thin-film transistor and a fabrication method thereof and more particularly, to a thin-film transistor that is capable of a highly reliable operation for use as a liquid crystal display (LCD) device and others and that is readily fabricated, and a fabrication method of the transistor.

2. Description of the Prior Art

Unlike conventional monolithic transistors that are formed in the inside of a semiconductor substrate, thin-film transistors are fabricated by stacking several thin films on a substrate. Therefore, the thin-film transistors have a simple and easy-to-fabricate configuration compared with the monolithic transistors. As a result, the thin-film transistors have been in widespread use as, for example, switching elements in a large-sized electronic device such as an LCD device.

Further, the simplicity of the device configuration and fabrication method of the thin-film transistors makes it possible to fabricate various applied products at low cost, which contributes to popularization of them on the market.

In recent years, the above simplicity of the thin-film transistors has been further improved and progressed.

Specifically, the basic components of a thin-film transistor are a substrate, a semiconductor thin film in which a conductive channel is formed on operation, a source electrode, a drain electrode, a gate insulating film, and a gate electrode. The source and drain electrodes, which are located apart from each other on a same side of the semiconductor film, are electrically connected to the semiconductor film. The gate insulating film is located on an opposite side of the semiconductor film to the source and drain electrodes. The gate electrode, which is located on the same side of the semiconductor film as the gate insulating film, is opposite to the semiconductor film through the gate insulating film. The conductive channel is formed in the gate-side surface region of the semiconductor film under application of a proper gate voltage.

The semiconductor thin film is typically formed by an undoped (or, i-type) semiconductor material. In this case, there is the need for interposing an $n^+$-type semiconductor film between the i-type semiconductor film and the opposing source and drain electrodes. The $n^+$-type semiconductor film is used to form source and drain contact regions between the undoped semiconductor film and the source and drain electrodes, respectively. The source and drain contact regions provide good Ohmic contacts therebetween.

From this point of view, various contrivances have been continued to minimize the number of necessary films and the number of necessary fabrication processes.

When the $n^+$-type semiconductor film serving as the source and drain contact regions is provided, the source and drain electrodes are short-circuited to each other by the $n^+$-type semiconductor film. Therefore, it is necessary to add a process of selectively removing the $n^+$-type semiconductor film by etching in a back channel section between the source and drain electrodes.

However, if the $n^+$-type semiconductor film is formed to be extremely thin, the etching process for selectively removing the back channel section of the $n^+$-type semiconductor film can be omitted without arising any problem about the off-resistance of the thin-film transistor. This knowledge was disclosed in the Japanese Non-Examined Patent Publication No. 59-172774 published in 1984.

FIG. 1 shows a first conventional thin-film transistor of the inverted staggered (or, bottom gate) type, which is disclosed in the Japanese Non-Examined Patent Publication No. 59-172774.

In FIG. 1, a gate electrode 1102 is formed on an insulating substrate 1101. A gate insulating film 1103 is formed on the substrate 1102 to cover the gate electrode 1102. An undoped or i-type amorphous silicon film 1104 is formed on the gate insulating film 1103. An $n^+$-type amorphous silicon film 1105 for source and drain contact regions is formed on the i-type amorphous silicon film 1104. A drain electrode 1106 and a source electrode 1107 are formed on the $n^+$-type amorphous silicon film 1105 to be apart from each other.

FIG. 2 shows a second conventional thin-film transistor of the staggered (or, top gate) type, which is disclosed in the Japanese Non-Examined Patent Publication No. 59-172774.

In FIG. 2, a drain electrode 1106 and a source electrode 1107 are formed on an insulating substrate 1101 to be apart from each other. An $n^+$-type amorphous silicon film 1105 for source and drain contact regions is formed on the substrate 1101 to cover the drain and source electrodes 1106 and 1107. The $n^+$-type amorphous silicon film 1105 is contacted with the substrate 1101 in a back channel section 1204 between the drain and source electrodes 1106 and 1107. An undoped amorphous silicon film 1104 is formed on the $n^+$-type amorphous silicon film 1105. A gate insulating film 1103 is formed on the undoped amorphous silicon film 1104. A gate electrode 1102 is formed on the gate insulating film 1103.

In FIGS. 1 and 2, the $n^+$-type amorphous silicon film 1105 is extremely thin to give a high off-resistance of $10^9$ Ω or higher between the source and drain electrodes 1107 and 1106. The $n^+$-type amorphous silicon film 1105 is not removed in the back channel section 1204. In other words, the $n^+$-type amorphous silicon film 1105 is continuous from the drain electrode 1106 to the source electrode 1107.

A third conventional thin-film transistor was disclosed in the Japanese Examined Patent Publication No. 6-22244 published in 1994 (which corresponds to the Non-Examined Patent Publication No. 62-81064 published in 1987). This transistor has phosphorus-doped regions in the respective surface regions of transparent source and drain electrodes and a transparent glass substrate. The phosphorus-doped regions are formed by exposing the source and drain electrodes and the substrate to phosphine ($PH_3$) plasma. The phosphorus-doped regions have substantially the same action as that of the extremely-thin $n^+$-type amorphous silicon film 1105 in FIGS. 1 and 2. Therefore, an etching process in the back channel section can be omitted while ensuring an Ohmic contact.

In detail, as shown in FIG. 3, a drain electrode 1106 and a source electrode 1107, which are formed by patterning a transparent conductive film, are located on a transparent glass substrate 1141 to be apart from each other. The drain and source electrodes 1106 and 1107 include phosphorus-doped regions 1106A and 1107A in their tops, respectively. The substrate 1141 includes a phosphorus-doped region 1141A in an exposed area between the drain and source electrodes 1106 and 1107. The phosphorus-doped regions 1106A, 1107A, and 1141A are formed by a plasma doping process of phosphorus.

A patterned undoped amorphous silicon film 1104 is formed on the substrate 1141 to partially cover the drain and source electrodes 1106 and 1107. A patterned gate insulating film 1103 is formed on the undoped amorphous silicon film 1104. A gate electrode 1102 is formed on the gate insulating film 1103. A silicon nitride film 1108 is formed on the substrate 1141 to cover the drain and source electrodes 1106 and 1107, the amorphous silicon film 1104, the gate insulating film 1103, and the gate electrode 1102.

A phosphorus-doped region 1145 is formed in the amorphous silicon film 1104 in its bottom. The phosphorus-doped region 1145 extends along the interfaces of the amorphous silicon film 1104 with the opposing drain and source regions 1106 and 1107 and with the opposing substrate 1141. The parts of the phosphorus-doped region 1145 located on the drain and source electrodes 1106 and 1107 serve as the Ohmic contact regions. The phosphorus-doped region 1145 is formed by diffusion or doping of the phosphorus atoms contained in the phosphorus-doped regions 1106A, 1107A, and 1141A.

FIG. 4 shows a fourth conventional thin-film transistor, which was disclosed in the IEEE ELECTRON DEVICE LETTERS, Vol. 9, No. 2, 1988, pp. 90 to 93. In this case, an additional insulating film is formed on a semiconductor thin-film on an opposite side to a gate electrode. The additional insulating film is selectively etched to be left only in a back channel section. Phosphorus ions are selectively implanted into the semiconductor thin-film using the remaining additional insulating film as a mask at a low acceleration energy. Thus, Ohmic contact regions for source and drain electrodes are made.

In detail, as shown in FIG. 4, a gate electrode 1102 is formed on a glass substrate 1241. A gate insulating film 1103 is formed on the substrate 1241 to cover the gate electrode 1102. An undoped amorphous silicon film 1104 is formed on the gate insulating film 1103. A patterned silicon nitride film 1209 is formed on the undoped amorphous silicon film 1104 to be opposite to the gate electrode 1102. A drain electrode 1106 and a source electrode 1107 are formed on the undoped amorphous silicon film 1104 and the gate insulating film 1103 to be apart from each other. The drain and source electrodes 1106 and 1107 are contacted with not only the undoped amorphous silicon film 1104 but also the silicon nitride film 1209.

After forming the silicon nitride film 1209, this film 1209 is selectively etched in such a way that the remaining part of the film 1209 has a width substantially equal to the channel length L. Then, using the remaining silicon nitride film 1209 as a mask, phosphorus ions are selectively implanted or doped at a low acceleration energy of 5.5 kV while exposing the entire exposed surfaces including those of the exposed amorphous silicon film 1104 and the silicon nitride film 1209 to a phosphine (PH$_3$) gas. Thus, two phosphorus-doped regions 1245 are formed in the undoped amorphous silicon film 1104 at its each end, and at the same time, a phosphorus-doped region 1209A is formed in the silicon nitride film 1209 in its top. No phosphorus ions are implanted into the part of the film 1104 just beneath the film 1209.

Thereafter, the ion-implanted amorphous silicon film 1104 is selectively etched to be a specific transistor island, as shown in FIG. 4. Then, the drain and source electrodes 1106 and 1107 are formed. The phosphorus-doped regions 1245A in the silicon film 1104 serve as Ohmic contact regions for the drain and source electrodes 1106 and 1107.

A fifth conventional thin-film transistor is shown in FIG. 5, which was disclosed in the Japanese Non-Examined Patent Publication No. 7-263702 published in 1995. In this transistor, ion implantation and plasma doping processes are successively carried out using a channel protection film as a mask. The later plasma doping process has a function of repairing the defects caused by the former ion implantation process. Subsequently, a chromium (Cr) film used for source and drain electrodes is formed on an undoped amorphous silicon film so as to generate reliable Ohmic contact regions made of a chromium silicide.

In detail, as shown in FIG. 5, a gate electrode 1102 is formed on a transparent glass substrate 1141. A gate insulating film 1103 is formed on the substrate 1141 to cover the gate electrode 1102. A patterned, undoped amorphous silicon film 1104 is formed on the gate insulating film 1103. A patterned silicon nitride film 1219 is formed on the undoped amorphous silicon film 1104 to be opposite to the gate electrode 1102. A drain electrode 1106 and a source electrode 1107 are formed on the gate insulating film 1103 to be apart from each other. The drain and source electrodes 1106 and 1107 are contacted with the undoped amorphous silicon film 1104 at each side.

After forming the silicon nitride film 1219, this film 1219 is selectively etched in such a way that the remaining part of the film 1219 has a width substantially equal to the channel length L. Then, using the remaining silicon nitride film 1219 as a mask, phosphorus ions are implanted at an acceleration energy of 30 kV or lower. This implantation process is termed the "ion-shower process". Thus, phosphorus-doped regions 1245A are formed in the undoped amorphous silicon film 1104 at its each end. No phosphorus ions are implanted into the part of the film 1104 just beneath the film 1219.

Subsequently, a plasma doping process is performed in a plasma-CVD chamber using a hydride or fluoride of a three- or five-valence element (such as phosphine) to repair the defects in the amorphous silicon film 104.

Further, without breaking the vacuum in the plasma-CVD chamber, a chromium film is deposited to produce a chromium silicide at the interface between the chromium film and the phosphorus-doped regions 1245A. Thereafter, the chromium film is patterned to form the drain and source electrodes 1107 and 1106. The chromium silicide film is left under the remaining chromium film and therefore, good Ohmic contact are generated between the drain and source electrodes 1106 and 1107 and the corresponding phosphorus-doped regions 1245A of the amorphous silicon film 1104. This ensures a good pattern-alignment margin.

With the first to fifth conventional thin-film transistors described above, the improvement is performed for the purpose of omitting some patterning or film-formation process or processes in a fabrication process sequence of a thin-film transistor. However, there is a drawback that they cannot provide a good operational characteristic and reliability with a good fabrication yield, while they offer an advantage of increased simplicity.

Specifically, a first problem is that the off-characteristic of a thin-film transistor degrades and accordingly, the operational reliability is decreased with age or time. This is because each of the first to fifth conventional transistors has the following disadvantages in device configuration and fabrication method.

With the first and second conventional transistors shown in FIGS. 1 and 2, which were disclosed in the Japanese Non-Examined Patent Publication No. 59-172774, the n$^+$-type amorphous silicon film 1105 with good electrical conductivity exists in the back channel section 1204, although the conductive film 1105 is extremely thin. Accordingly, a leakage current flowing between the drain and source electrodes 1106 and 1107 cannot be minimized.

With the third conventional transistor shown in FIG. 3, which was disclosed in the Japanese Examined Patent Publication No. 6-22244, the phosphorus-doped region 1145 of the amorphous silicon film 1104 extends along the back channel section 1204. This phosphorus-doped region 1145 results in a leakage current between the drain and source electrodes 1106 and 1107.

Therefore, the first to third conventional transistors usually have the transfer characteristic as shown by the curve "b" in FIG. 8, which is poor in off-characteristic.

A second problem is that the n+-type amorphous silicon film 1105 having a high off-resistance of $10^9$ Ω or higher is very difficult to be realized in the first and second conventional transistors in FIGS. 1 and 2. This is because the electric resistance of the film 1105 is very sensitive to the doping concentration of phosphorus from the phosphine gas and others and consequently, the formation process of the film 1105 is difficult to be controlled. If the electric resistance is high, the Ohmic contact with the source and drain electrodes 1107 and 1106 will deteriorate, while the leakage current between the electrodes 1107 and 1106 is decreased.

With the third conventional transistor shown in FIG. 3, the plasma doping process is difficult to be controlled. If this plasma doping process is continued for several minutes, the off-resistance will decrease due to the leakage current. Therefore, the doping time during the plasma doping process must be set as short as one minute. This means that no good reproducibility is realized.

Therefore, an extremely poor off-characteristic as shown with the curve "a" in FIG. 8 has been often exhibited.

A third problem is that a leakage current tends to flow between the drain and source regions 1106 and 1107 through the phosphorus-doped region 1209A formed in the top of the upper insulating film 1209 in the fourth conventional transistor shown in FIG. 4. Since no phosphorus ions are implanted into the undoped amorphous silicon film 1104 in the back channel section 1204, no leakage current flows through the region 1204.

Further, because the drain and source electrodes 1106 and 1107 are separated by an opening at a location on the insulating film 1209, the distance between the opposing ends of the electrodes 1106 and 1107 is shorter than the channel length. This means that the fabrication yield is lowered.

A fourth problem is that a process of forming the channel protection film 1209 or 1219 is necessary and as a result, the number of fabrication processes is increased in the fourth and fifth conventional transistors shown in FIGS. 4 and 5.

Because a chromium film is used for the source and drain electrodes 1107 and 1106 to form a chromium silicide in the fifth conventional transistor in FIG. 5, the lateral distance between the source and drain electrodes 107 and 106 can be made longer compared with the fourth conventional transistor in FIG. 4. However, the surface of the channel protection film 1219 is ion-implanted as in the fourth conventional transistor. Thus, the leakage current cannot be thoroughly prevented in the fifth conventional transistor.

The obtainable transfer characteristic of the fifth conventional transistor in FIG. 5 is shown with the curve "c" in FIG. 8, which has a considerable improvement, as compared to the curves "b" and "a", but insufficient.

A fifth problem is that the fifth conventional transistor in FIG. 5, which has the improved characteristic as shown with the curve "c" in FIG. 8, increases the number of steps in the fabrication processes. Specifically, the fifth conventional transistor necessitates a hydrogen plasma annealing process in conjunction with the plasma doping process, in addition to the ion implantation process. This is because the transistor is damaged by the ion implantation and thus, any repairing process is required for repairing the damage.

SUMMARY OF THE INVENTION

Accordingly, an object of the present invention is to provide a thin-film transistor having a simple configuration and improved off-characteristic, and a fabrication method of the transistor.

Another object of the present invention is to provide a thin-film transistor having an improved operational reliability and fabrication yield, and a fabrication method of the transistor.

The above objects together with others not specifically mentioned will become clear to those skilled in the art from the following description.

According to a first aspect of the present invention, a thin-film transistor is provided, which includes a substrate and a layered structure formed on the substrate.

The layered structure includes a semiconductor film, a gate insulating film located on a first side of the semiconductor film to be overlapped with the semiconductor film, a gate electrode located on the gate insulating film on the first side of the semiconductor film to be selectively overlapped with the semiconductor film, a source electrode located on a second side of the semiconductor film to be electrically connected to the semiconductor film, and a drain electrode located on the second side of the semiconductor film to be electrically connected to the semiconductor film and to be apart from the source electrode.

The semiconductor film has a back channel section between opposite ends of the source and drain electrodes. The back channel section is located on a back of the semiconductor film with respect to an electrically conductive channel. The back channel section includes a high-resistance part with a high electric resistance. The high-resistance part contains n- and p-type impurities.

With the thin-film transistor according to the first aspect of the present invention, because the back channel section of the semiconductor film includes the high-resistance part, a leakage current is suppressed to flow between the source and drain electrodes. This means that the off-characteristic of the thin-film transistor is improved, which raises the operational reliability of the transistor.

Also, it is sufficient that the high-resistance part is simply formed in the back channel section of the semiconductor film by doping the n- and p-type impurities. Accordingly, the transistor configuration is very simple and the fabrication yield is raised If the back channel section is doped with an n-type (or, p-type) impurity, a p-type (or, n-type) impurity is further doped into the back channel section to thereby cancel the electrical-conductivity increase due to the doped n-type (or, p-type) impurity.

In a preferred embodiment of the thin-film transistor according to the first aspect, phosphorus (P) is used as an n-type impurity and boron (B) is used as a p-type impurity.

In another preferred embodiment of the thin-film transistor according to the first aspect, the semiconductor film has a two-layer structure including a first semiconductor subfilm made of an undoped semiconductor material and a second semiconductor subfilm made of an n-type semiconductor material. The high-resistance part of the back channel section is formed in the second semiconductor subfilm.

In still another preferred embodiment of the thin-film transistor according to the first aspect, the semiconductor film is made of an undoped semiconductor material. The semiconductor film has a pair of n-type regions contacted with the source and drain electrodes, respectively. The high-resistance part of the back channel section is located on a same side of the semiconductor film as that of the pair of n-type regions.

In this case, it is preferred that an additional film containing a p-type impurity is contacted with the back channel section of the semiconductor film. This is because the p-type impurity in the additional film is automatically doped into the back channel section during a fabrication process sequence.

The transistor according to the first aspect may be of the staggered type where the gate electrode is located on the substrate, or of the inverted staggered type where the source and drain electrodes are located on the substrate.

According to a second aspect of the present invention, a fabrication method of a thin-film transistor is provided, which fabricates the thin-film transistor according to the first aspect.

The method according to the second aspect includes the following steps (a) to (c):

(a) A layered structure is formed on a substrate. The layered structure includes a semiconductor film, a gate insulating film located on a first side of the semiconductor film to be overlapped with the semiconductor film, a gate electrode located on the gate insulating film on the first side of the semiconductor film to be selectively overlapped with the semiconductor film, a source electrode located on a second side of the semiconductor film to be electrically connected to the semiconductor film, and a drain electrode located on the second side of the semiconductor film to be electrically connected to the semiconductor film and to be apart from the source electrode.

The semiconductor film has a back channel section between opposite ends of the source and drain electrodes. The back channel section is located on a back of the semiconductor film with respect to an electrically conductive channel.

(b) An impurity of a first conductivity type is doped into the back channel section of the semiconductor film in the layered structure.

(c) An impurity of a second conductivity type is doped into the back channel section of the semiconductor film in the layered structure, thereby forming a high-resistance part with a high electric resistance. The high-resistance part contains the impurities of the first and second conductivity types.

With the fabrication method of a thin-film transistor according to the second aspect of the present invention, the high-resistance part is formed in the back channel section of the semiconductor film, which is located between the source and drain regions, by doping the impurities of the first and second conductivity types into the back channel section.

Therefore, the thin-film transistor according to the first aspect of the present invention is fabricated.

In a preferred embodiment of the fabrication method according to the second aspect, phosphorus (P) is used as an n-type impurity and boron (B) is used as a p-type impurity.

In another preferred embodiment of the method according to the second aspect, the step (c) is performed by plasma-doping the impurity of the second conductivity type. It is preferred that a plasma containing a hydride gas is used in the process of the plasma-doping.

In still another preferred embodiment of the method according to the second aspect, the step (c) is performed by contacting the semiconductor film with a layer containing the impurity of the second conductivity type. It is preferred that a borosilicate glass layer is used in this step (c)

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
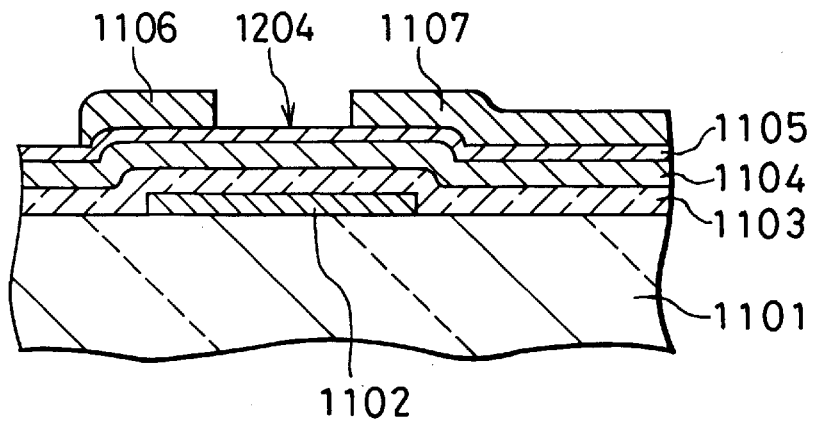
FIG. 1 is a partial cross-sectional view of a first conventional thin-film transistor.

Preferred embodiments of the present invention will be described below referring to the drawings attached.

FIRST EMBODIMENT

Figure 9:
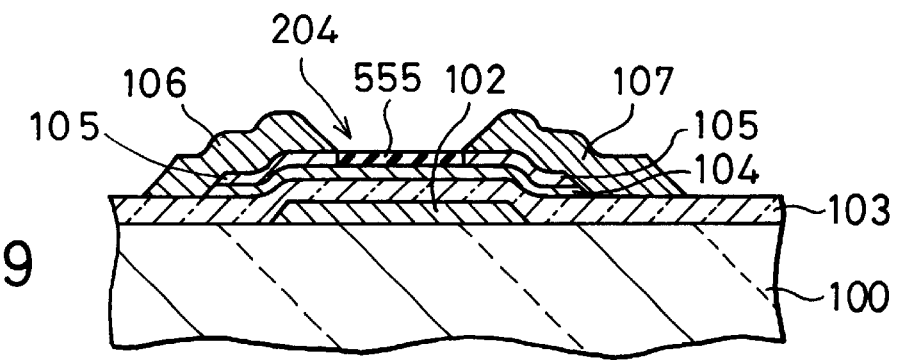
FIG. 9 is a partial cross-sectional view of a thin-film transistor according to a first embodiment of the present invention.

A thin-film transistor according to a first embodiment of the invention is of an inverted staggered type, as shown in FIG. 9.

A gate electrode 102 is formed on a substrate 100 made of a quartz glass. The gate electrode 102 is formed by a patterned chromium (Cr) film (200 nm thick). A silicon nitride ($SiN_x$) film (300 nm thick), which serves as a gate insulating film 103, is formed on the substrate 100 to cover the gate electrode 102.

An undoped, hydrogenated amorphous silicon (Si) film (30 nm thick) 104 is formed on the gate insulating film 103. An electrically conductive channel is formed in the film 104 under application of a suitable gate voltage. An $n^+$-type hydrogenated amorphous silicon film (5 nm thick) 105, which is doped with phosphorus, is formed on the film 104. The $n^+$-type hydrogenated amorphous silicon film 105 serves to form source and drain contact regions. The two hydrogenated amorphous silicon films 104 and 105 are patterned to be an island to be opposed to (or, be overlapped with) the gate electrode 102.

A source electrode 107 and a drain electrode 106 are formed on the exposed gate insulating film 103 to be apart from each other. The source and drain electrodes 107 and 106 are contacted with the $n^+$-type hydrogenated amorphous silicon film 105. The source and drain electrodes 107 and 106 are formed by patterning an aluminum (Al) film (500 nm thick).

The undoped and $n^+$-type hydrogenated amorphous silicon films 104 and 105 have a back channel section 204 between the source and drain electrodes 107 and 106. The back channel section 204 is located to be opposed to the gate electrode 102. The $n^+$-type hydrogenated amorphous silicon film 105 has a high-resistance region 555 in the back channel section 204. A boron-doped insulating film 155 such as a BSG film is formed in contact with the high resistance region 555. The high-resistance region 555 is doped with phosphorus and boron, in other words, n- and p-type impurities. Therefore, this region 555 may be called as a phosphorus/boron mixed region.

Next, a fabrication method of the thin-film transistor according to the first embodiment will be described below.

Figure 10A:
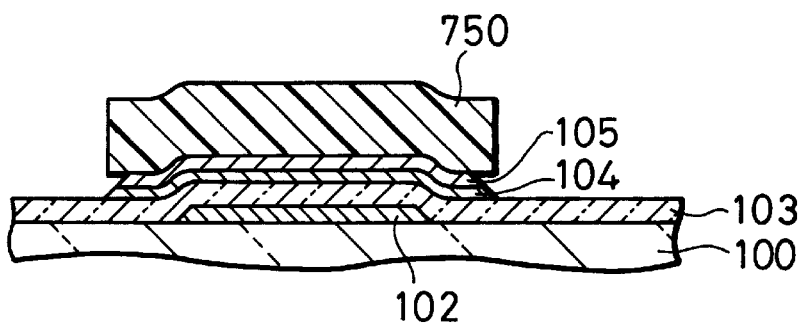
FIGS. 10A to 10C are partial cross-sectional views showing a fabrication process sequence of the thin-film transistor according to the first embodiment of FIG. 9, respectively.

As shown in FIG. 10A, after forming the gate electrode 102 on the substrate 100, the silicon nitride film (300 nm thick) serving as the gate insulating film 103, the non-doped amorphous silicon film 104 (300 nm thick), and the phosphorus-doped, $n^+$-type amorphous silicon film 105 (5 nm thick) are successively deposited to be stacked on the substrate 100 by plasma CVD processes, respectively.

Figure 10B:
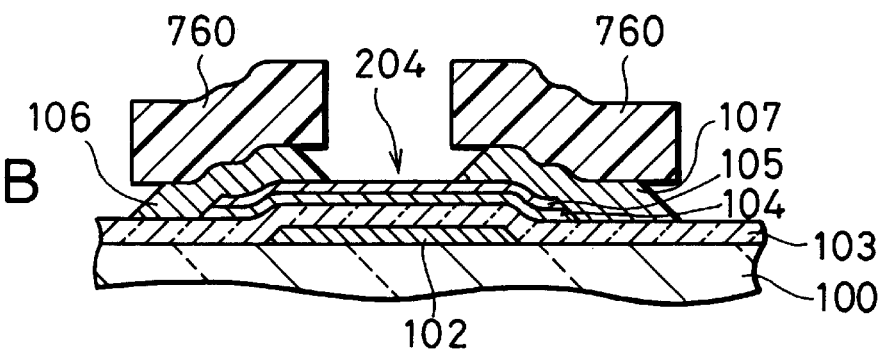

Next, as shown in FIG. 10B, a patterned photoresist film 750 is formed on the $n^+$-type amorphous silicon film 105. Then, using the photoresist film 750 as a mask, the two amorphous silicon films 104 and 105 are selectively removed by a dry etching process, resulting in an island-shaped stacked structure of the films 104 and 105. Thereafter, the photoresist film 750 is removed.

An aluminum film (500 nm thick) for the source and drain electrodes 107 and 106 is deposited by a sputtering process on the gate insulating film 103 to cover the island-shaped stacked structure. A patterned photoresist film 760 is formed on the aluminum film. The aluminum film is selectively removed by a wet etching process using the photoresist film 760 as a mask, thereby forming the source and drain electrodes 107 and 106, as shown in FIG. 10B. At this stage, the $n^+$-type amorphous silicon film 105 is exposed from the source and drain electrodes 107 and 106 in the back channel section 204. The photoresist film 760 is then removed.

Figure 10C:
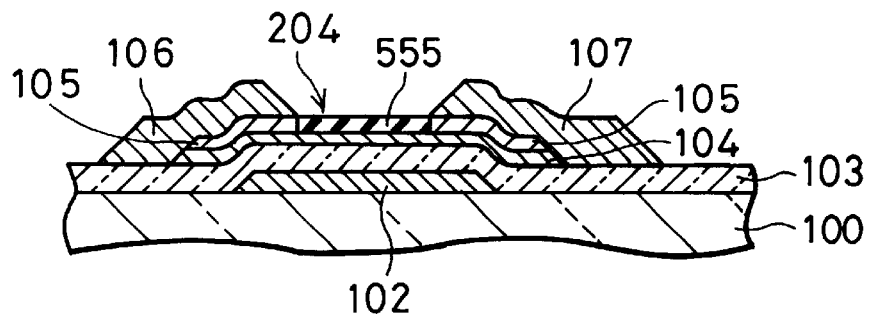

Further, as shown in FIG. 10C, using a parallel-plate plasma generating apparatus, boron is selectively doped into the $n^+$-type amorphous silicon film 105 in the back channel section 204. Thus, the phosphorus/boron mixed part (or, high-resistance part) 555 is formed in the back channel section 204.

The boron doping process is carried out under the following condition. The substrate 100 is set as a temperature of 250° C. As a reaction gas, a gaseous mixture of an argon (Ar) gas and a 0.3%-diborane ($B_2H_6$) gas is used. Diborane may be replaced with any other boron hydride. The reaction gas is continuously pumped so that the gas pressure in the reaction chamber is held at 20 Pa. $B_2H_6$ plasma is generated by exciting the reaction gas with a high-frequency electric power of 0.3 W/cm$^2$ at a frequency of 13.56 MHz. The substrate assembly is exposed to the $B_2H_6$ plasma for four minutes, thereby doping selectively the boron contained in the reaction gas into the exposed part of the $n^+$-type amorphous silicon film 105 in the back channel section 204.

The photoresist film 760 may be removed after the above plasma doping process of boron in FIG. 10B. In this case, there is an additional advantage that the exposed surfaces of the $n^+$-type amorphous silicon film 105, the drain and source electrodes 106 and 107, and the gate insulating film 103 are cleaned simultaneously during the removing process of the photoresist film 760.

Any popular parallel-plate plasma apparatus may be used. The plasma CVD apparatus for forming a protection film or the dry etching apparatus may be used for the above plasma doping process of boron.

For example, the above plasma doping process of boron may be carried out using the plasma CVD apparatus for forming the protective film just before forming the protective film. Further, this plasma doping process may be performed using the dry etching apparatus for forming the source and drain electrodes 107 and 106. In this case, after the dry etching process is completed, the reaction chamber is exhausted once and then, it is set at the specific plasma doping conditions. Thereafter, the plasma doping process is performed in this reaction chamber of the dry etching apparatus.

Thus, the phosphorus/boron mixed part 555 is realized with a simplified process of exposing the n+-type amorphous silicon film 105 to the diborane ($B_2H_6$) plasma.

The n+-type amorphous silicon film 105 is typically not more than 20 nm in thickness, preferably, approximately 5 nm in thickness. Therefore, it takes approximately one to ten minutes for the phosphorus/boron mixed part 555 to have a thickness of approximately 5 to 20 nm.

Figure 8:
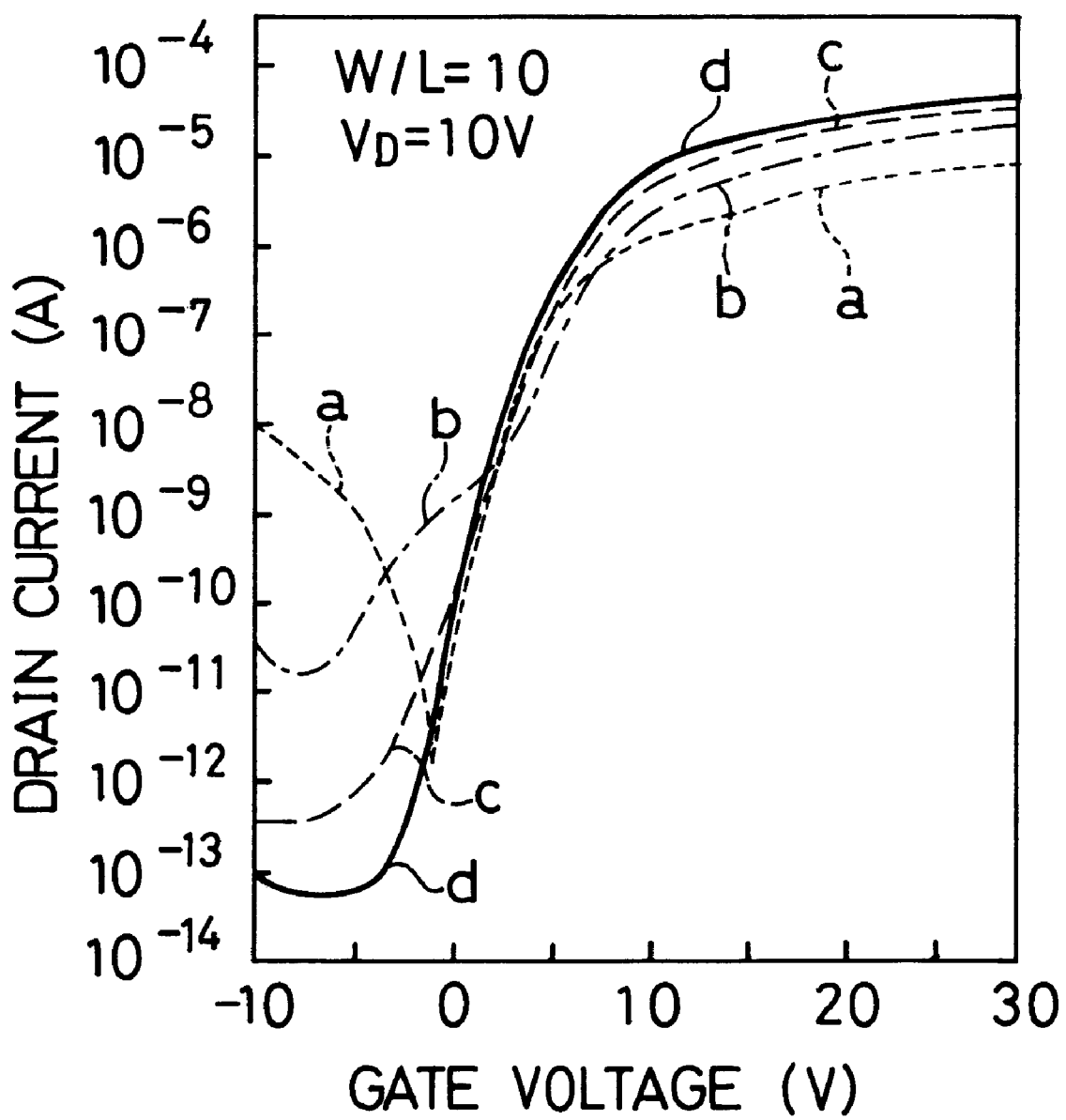
FIG. 8 is a graph showing the typical drain-current characteristics as a function of the gate voltage of the conventional and inventive thin-film transistors.

The concentration of the doped boron in the n+-type amorphous silicon film 105 is decreased as the depth is increased from its exposed surface. However, the effect of the doped boron is sufficiently large. Compared to the characteristic of a thin-film transistor where the n+-type amorphous silicon film 105 has no phosphorus/boron mixed part in the back channel section 204, the characteristic is remarkably improved. For example, the conventional characteristic as shown with the curve "b" in FIG. 8 is changed into one as shown with the curve "d", where the convexity in the off-characteristic region of the curve "b" is eliminated.

In addition, the thin-film transistor according to the first embodiment can be fabricated by using popular apparatuses and process conditions can be set easily, resulting in a good reproducibility and a good yield. Further, due to the existence of the high-resistance part 555, the transistor characteristic is stabilized over a long period of time and therefore, the operational reliability is improved.

The high-resistance part 555 in the n+-type amorphous silicon film 105 has a function of suppressing the surface leakage current. Therefore, the thin-film transistor according to the first embodiment may be applied to practical use without any special protection film for the n+-type amorphous silicon film 105.

Finally, the boron-doped insulating film 155 with a thickness of approximately 50 to 100 nm is formed in contact with the high resistance region 555, as shown in FIG. 10C.

With the thin-film transistor according to the first embodiment, compared to the above conventional transistor structure as shown in FIG. 1, the number of necessary patterning processes such as film formation and photolithography processes is not increased. The plasma doping process of boron is a type of surface treatment of the entire substrate 100 and consequently, this process can be practiced with ease.

A passivation film is often formed on the gate insulating film 103 to cover the thin-film transistor. In this case, the formation of the high-resistance part 555 can be practiced by making a plasma discharge in an atmosphere containing diborane ($B_2H_6$) using a plasma CVD apparatus. Thereafter, the formation of the passivation film is performed using the same plasma CVD apparatus in an atmosphere containing silane ($SiH_4$).

With the thin-film transistor according to the first embodiment, as described above, boron (B) is directly doped into the n+-type amorphous silicon film 105 for Ohmic contact in the back channel section 204 using plasma containing a boron hydride gas. Thus, the previously doped phosphorus in the film 105 can be compensated with the newly doped boron to thereby generate the phosphorus/boron mixed part 555 having an increased resistance. Therefore, a drain leakage current can be held to a minimum.

Since the top of the high resistance region 555 is covered with the boron-doped insulating film 155, there is an advantage that the property of the surface of the high resistance region 555 can be stabilized.

The above description is for the thin-film transistor of the inverted staggered type. A thin-film transistor of a staggered type according to the first embodiment is shown in FIG. 26, in which the same reference numerals as those in FIG. 9 are added to the same or corresponding elements in FIG. 26.

The substrate 100 has an insulating film 229 made of silicon oxide or silicon nitride. The insulating film 229 is exposed to $B_2H_6$ plasma to directly dope boron into the film 229 thereby forming a boron-doped region 155 in the film. Then, a chromium (Cr) film or an indium tin oxide (ITO) film is deposited on the doped insulating film 229, and is patterned to form the source and drain electrodes 107 and 106 and a pixel electrode 117. The source electrode 107 is unified with the pixel electrode 117.

Figure 26:
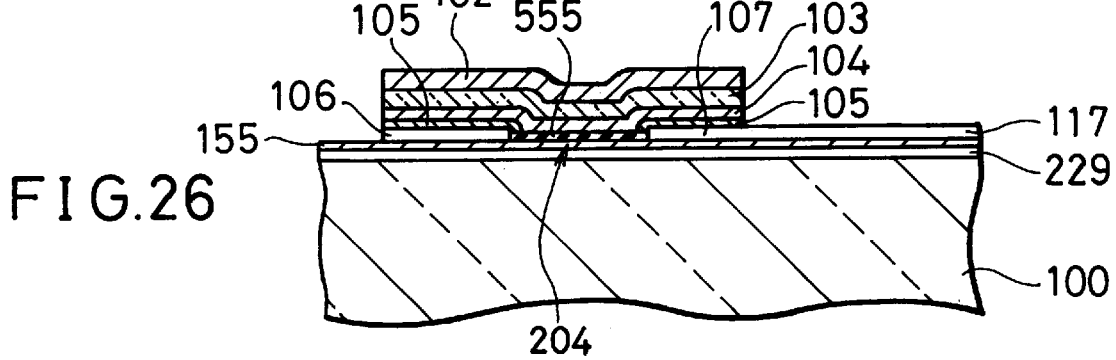
FIG. 26 is a partial cross-sectional view of a thin-film transistor according to a variation of the first embodiment of the present invention in FIG. 9.

The n+-type hydrogenated amorphous silicon film 105, the undoped hydrogenated amorphous silicon film 104, the gate insulating film 103, and the gate electrode 102 are successively deposited on the Cr or ITO film, and are patterned to form a transistor island, as shown in FIG. 26.

Thus, the thin-film transistor of a staggered type according to the first embodiment shown in FIG. 26 is completed.

Since the n+-type hydrogenated amorphous silicon film 105 is contacted with the boron-doped insulating film 229 of the substrate 100, the boron in the boron-doping region 155 of the insulating film 229 automatically diffuses into the silicon film 105 due to heat. Thus, the high-resistance part or phosphorus/boron mixed part 555 is formed in the back channel section 204.

SECOND EMBODIMENT

Figure 11:
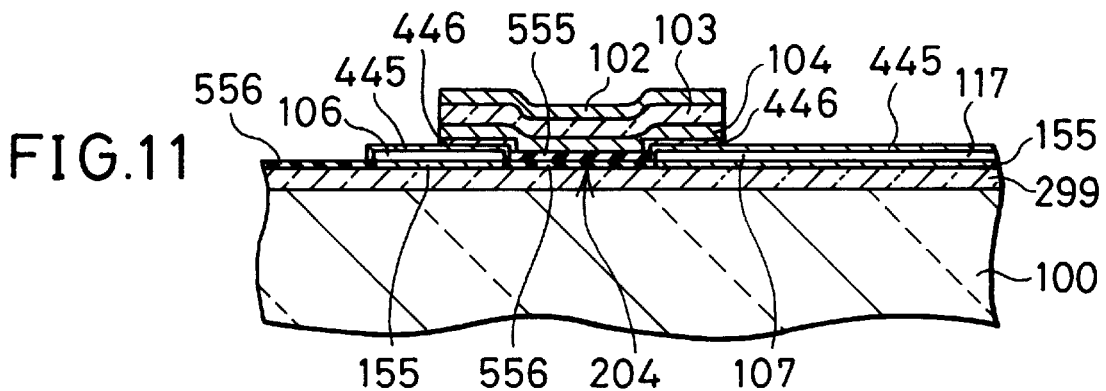
FIG. 11 is a partial cross-sectional view of a thin-film transistor according to a second embodiment of the present invention.

FIG. 11 shows a thin-film transistor according to a second embodiment, which is of a staggered type.

In FIG. 11, a silicon oxide ($SiO_x$) film 229 (400 nm thick) is deposited on a substrate 100 made of a soda-lime glass. A silicon nitride ($SiN_x$) film may be used instead of the silicon oxide film.

A source electrode 107, a drain electrode 106, and a pixel electrode 117 are formed on the silicon oxide film 229. The source electrode 107 is unified with the pixel electrode 117. The source, drain, and pixel electrodes 107, 106, and 117 are formed by patterning an ITO film (100 nm thick).

On the source electrode 107, the drain electrode 106, and the area between these electrodes 107 and 106, a non-doped hydrogenated amorphous silicon film 104 (20 nm thick), a gate insulating film 103 made of a silicon nitride ($SiN_x$) film (200 nm thick), and a gate electrode 102 made of a molybdenum (Mo) film (250 nm thick) are formed to be stacked. The silicon film 104, the gate insulating film 103, and the gate electrode 102 are patterned to have a same island shape.

Boron-doped regions 155 and a boron/phosphorus-doped region 556 are formed in the surface area of the $SiO_x$ film 229. The boron/phosphorus-doped region 556, which is doped with boron and phosphorus, is located between the drain and source electrodes 106 and 107 (i.e., a back channel section 204) and in the outside of the drain electrode 106. The boron-doped regions 155 are located beneath the drain, source, and pixel electrodes 106, 107, and 117.

A phosphorus-doped region 446 is formed in the upper surface area of the drain electrode 106 and the source electrode 107. Another phosphorus-doped region 445 is formed in the surface area of the pixel electrode 117.

An undoped hydrogenated amorphous silicon film 104, a gate insulating film 103, and a gate electrode 102 are formed to be stacked on the drain and source electrodes 106 and 107. The silicon film 104, the gate insulating film 103, and the gate electrode 102 are patterned to have a same island shape.

A pair of phosphorus-doped regions 446 and a phosphorus/boron mixed region 555 are formed in the lower surface area of the undoped hydrogenated amorphous silicon film 104. The pair of phosphorus-doped regions 446 are formed to be opposite to the drain and source electrodes 106 and 107, respectively. The pair of phosphorus-doped regions 446 serve as Ohmic contact regions for the drain and source electrodes 106 and 107.

The phosphorus/boron mixed region 555 in the undoped amorphous silicon film 104 is formed by plasma diffusion of the boron and phosphorus that have been doped into the phosphorus/boron-doped region 556 of the $SiO_x$ film 229 into the amorphous silicon film 104. Through this plasma diffusion process, the boron and phosphorus can be diffused to a depth of 100 nm or less (preferably, of approximately 10 nm), respectively. The diffusion depth of the boron and phosphorus is approximately the same. Thus, not only Ohmic contact between the undoped amorphous silicon film 104 and the source and drain electrodes 107 and 106 is realized by the phosphorus-doped regions 446, but also the electrical resistance increase in the back channel section 204 is achieved by the phosphorus/boron mixed region 555.

Next, a fabrication method of the thin-film transistor according to the second embodiment is described.

Figure 12A:
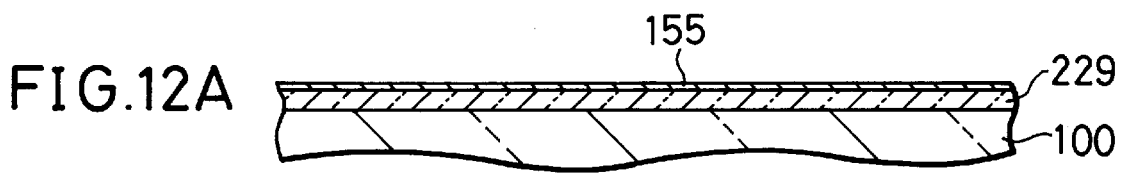
FIGS. 12A to 12C are partial cross-sectional views showing a fabrication process sequence of the thin-film transistor according to the second embodiment of FIG. 11, respectively.

First, as shown in FIG. 12A, the $Sio_x$ film 229 (200 nm thick) is deposited on the soda-line glass substrate 100. Next, the surface of the $SiO_x$ film 229 is exposed to a diborane ($B_2H_6$) gas plasma to dope boron (B) into the $SiO_x$ film 229, thereby forming the boron-doped region 155 in the film 229. The state at this stage is shown in FIG. 12A.

This plasma doping process is performed using the same apparatus as that for the $SiO_x$ film 229. The substrate 100 is set at a temperature of 300° C. An argon (Ar) gas containing a $B_2H_6$ gas by 0.2% is used as a reaction gas. The reaction gas is kept exhausted during the process so that the gas pressure in the reaction chamber is held at 15 Pa. $B_2H_0$ plasma is generated with a high-frequency electric power of 0.3 W/cm$^2$ at a frequency of 13.56 MHz. The exposure of the $SiO_x$ film 229 to the $B_2H_0$ plasma is started just after the completion of deposition of the film 229 and kept for 10 minutes.

This plasma doping process of the $SiO_x$ film 229 may be achieved with the use of another apparatus. Any sputtering apparatus for subsequent film formation processes rather than a special plasma doping apparatus may be used too. In this case, the plasma doping process is performed before the desired film formation processes.

Next, an ITO film (200 nm thick) is deposited by a sputtering process on the boron-doped $SiO_x$ film 229. The ITO film is then patterned to form the drain, source, and pixel electrodes 106, 107, and 117.

Figure 12B:
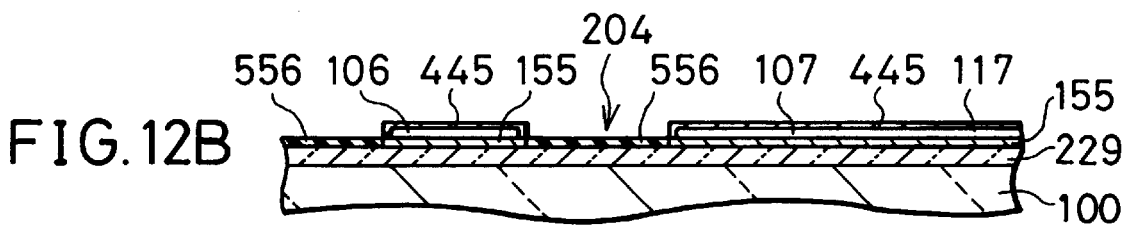

Subsequently, the drain, source, and pixel electrodes 106, 107, and 117 and the uncovered $SiO_x$ film 229 are exposed to phosphine ($PH_3$) plasma. Thus, the phosphorus-doped regions 445 are formed in the surface areas of the drain, source, and pixel electrodes 106, 107, and 117. At the same time, the uncovered area of the $SiO_x$ film 229 is also doped with phosphorus, resulting in the phosphorus/boron doped region 556. The state at this stage is shown in FIG. 12B.

The exposure process to the phosphine ($PH_3$) plasma is performed in the following way.

The substrate 100 is set as a temperature of 320° C. As a reaction gas, a gaseous mixture of an argon (Ar) gas and a 0.5%-phosphine ($PH_3$) gas is used. The reaction gas is continuously pumped so that the gas pressure in the reaction chamber is held at 10 Pa. The phosphine plasma is generated by exciting the reaction gas with a high-frequency electric power of 0.25 W/cm$^2$ at a frequency of 13.56 MHz. The substrate assembly is exposed to the phosphine plasma for two minutes, thereby doping selectively the phosphorus contained in the reaction gas into the electrodes 106, 107, and 117.

This exposure process to the phosphine plasma may be achieved with the use of a special plasma doping apparatus. However, if this process is practiced in a plasma-CVD apparatus to be used subsequently, there is an additional advantage that not only the undoped amorphous silicon film 104 can be formed consecutively but also a better Ohmic contact can be easily given.

Figure 12C:
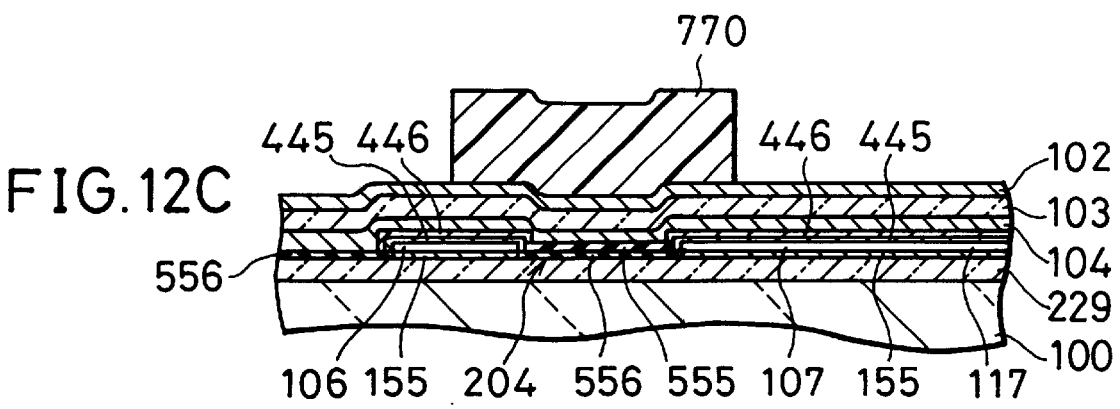

Next, as shown in FIG. 12C, the non-doped hydrogenated amorphous silicon film (50 nm thick) 104 and the silicon nitride ($SiN_x$) film (250 nm thick) for gate insulating film 103 are formed to be stacked on the $SiO_x$ film 229 to cover the drain, source, and pixel electrodes 106, 107, and 117. The molybdenum (Mo) film (250 nm thick) for the gate electrode 102 is formed on the silicon nitride film 103 by a sputtering process.

A patterned photoresist film 770 is formed on the molybdenum film. Then, using the photoresist film 770 as a mask, the non-doped hydrogenated amorphous silicon film 104, the silicon nitride ($SiN_x$) film, and the molybdenum film are patterned to have a same island shape, as shown in FIG. 11. Thus, the thin-film transistor according to the second embodiment is completed.

Through the subsequent processes after the formation of the non-doped hydrogenated amorphous silicon film 104, the boron and phosphorus contained in the phosphorus/boron doped region 556 and the boron contained in the boron-doped regions 445 diffuse into the opposing areas of the amorphous silicon film 104. Thus, the boron/phosphorus mixed region 555 is formed in the back channel section 204 and the Ohmic contact regions 446 are formed on the respective boron-doped regions 445.

With the fabrication method of the thin-film transistor according to the second embodiment, two plasma doping processes of phosphorus plasma doping for Ohmic contact and boron plasma doping for compensation of the phosphorus doping are practiced. However, the undoped amorphous silicon film 104 is not directly doped with these two dopants, but the phosphorus and boron doped into the $SiO_x$ film 229 are introduced into the film 104 by diffusion.

Thus, a damage due to ion impact or bombardment is not caused and consequently, there is no need for a separate hydrogen-plasma annealing process, which is required in the ion implantation.

Figure 3:
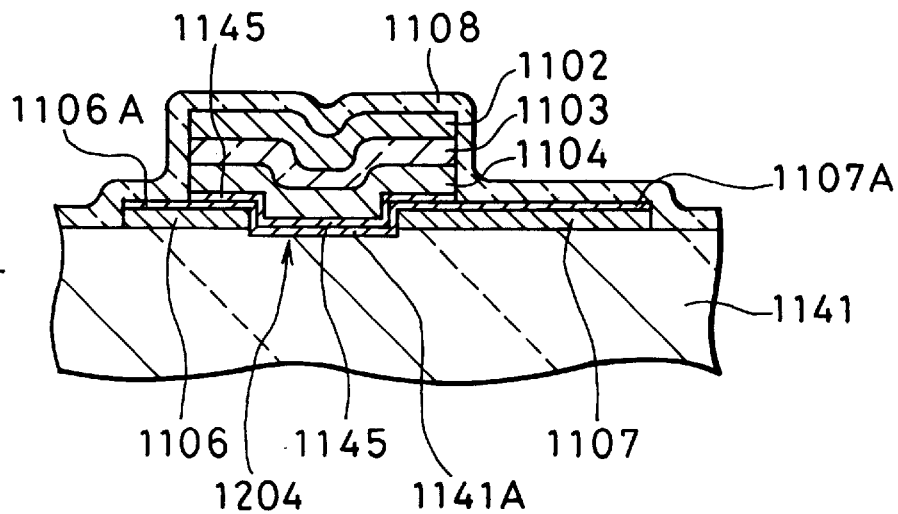
FIG. 3 is a partial cross-sectional view of a third conventional thin-film transistor.
Figure 4:
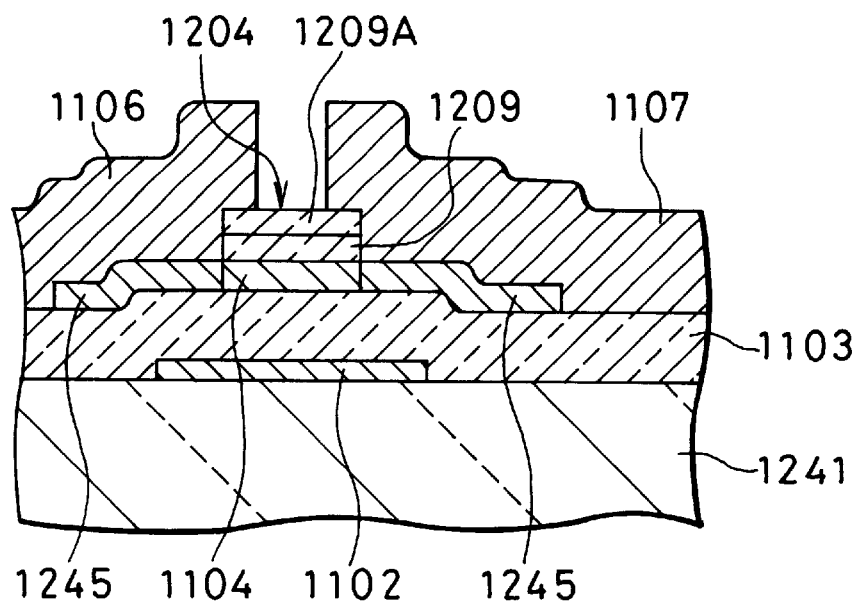
FIG. 4 is a partial cross-sectional view of a fourth conventional thin-film transistor.
Figure 5:
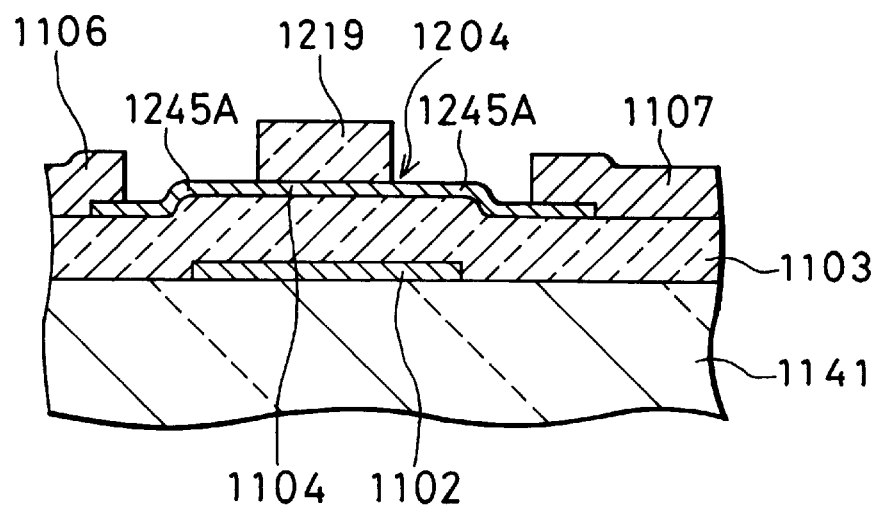
FIG. 5 is a partial cross-sectional view of a fifth conventional thin-film transistor.

In the third conventional thin-film transistor shown in FIG. 3, the Ohmic contact film 1145 is left in the back channel section 204, which causes a leakage current. However, with the thin-film transistor according to the second embodiment, since both phosphorus and boron are doped into the phosphorus/boron mixed region 555 located in the back channel section 204, the phosphorus/boron doped region 555 has a high electrical resistance.

As a result, the characteristic of the thin-film transistor according to the second embodiment, for example, the conventional characteristic as shown with the curve "a" in FIG. 8 is changed into one as shown with the curve "d". Accordingly, the off-characteristic is remarkably improved.

In addition, the fabrication processes may be realized by using an apparatus that is popularly used in another process or processes, and the process conditions are popular and are set easily. Accordingly, a good reproducibility and a good yield are obtained.

An insulating film provided on a glass substrate is generally intended to prevent the substrate from being contaminated with sodium (Na) ions and others. However, with the second embodiment of the present invention, the $SiO_x$ film 229 on the substrate 100 is provided not only to prevent such a contamination but to effectively form the impurity doped regions 555 and 446.

The $SiO_x$ film formed by a plasma CVD process is effective for this purpose because this $SiO_x$ film contains hydrogen (H) and therefore, phosphorus and boron are readily doped into the film.

There is an additional advantage that the $SiO_x$ film provided on the glass substrate requires no patterning process using the photolithography technique.

The plasma doping processes in the second embodiment are a type of surface treatment, and can be practiced with ease. For example, when an ITO film or another metallic film is deposited with a sputtering apparatus, the plasma doping processes can be performed in the same sputtering apparatus prior to the sputtering process of the wanted metallic film.

In the fabrication method according to the second embodiment, the following changes make it possible to fabricate the thin-film transistor of a staggered type shown in FIG. 26. Specifically, an $n^+$-type hydrogenated amorphous silicon film, an undoped hydrogenated amorphous silicon film, a gate insulating film, and a molybdenum film are successively deposited immediately after forming drain, source, and pixel electrodes (without exposing them to phosphine plasma). Then, these four films are patterned using the photoresist film 770 as a mask. Thus, the configuration as shown in FIG. 26 is obtained.

THIRD EMBODIMENT

Figure 13:
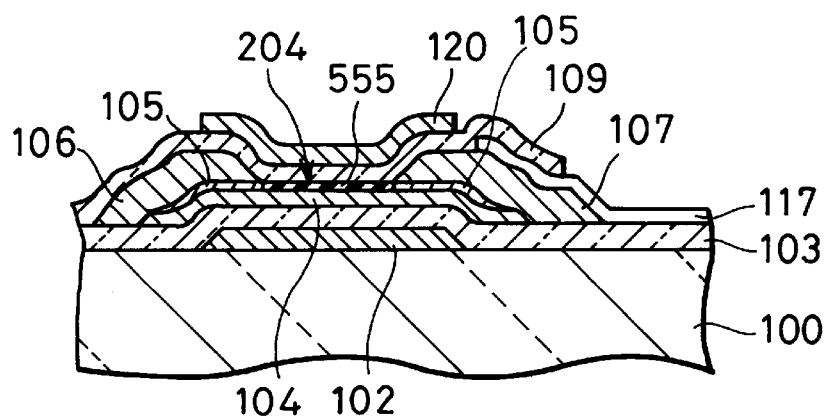
FIG. 13 is a partial cross-sectional view of a thin-film transistor according to a third embodiment of the present invention.

FIG. 13 shows a thin-film transistor of an inverted staggered type according to a third embodiment.

A gate electrode 102 is formed on a substrate 100 made of an aluminum silicate glass. The gate electrode 102 is formed by a patterned chromium (Cr) film (150 nm thick). A silicon nitride ($SiN_x$) film (350 nm thick), which serves as a gate insulating film 103, is formed on the substrate 100 to cover the gate electrode 102.

An undoped, hydrogenated amorphous silicon (Si) film (70 nm thick) 104 is formed on the gate insulating film 103. An $n^+$-type hydrogenated amorphous silicon film (3 nm thick) 105, which is doped with phosphorus, is formed on the film 104. The $n^+$-type hydrogenated amorphous silicon film 105 serves to form source and drain contact regions. The two hydrogenated amorphous silicon films 104 and 105 are patterned to be an island to be opposed to (or, be overlapped with) the gate electrode 102.

A source electrode 107 and a drain electrode 106 are formed on the exposed gate insulating film 103 to be apart from each other. The source and drain electrodes 107 and 106 are contacted with the $n^+$-type hydrogenated amorphous silicon film 105. The source and drain electrodes 107 and 106 are formed by patterning a chromium (Cr) film (200 nm thick).

The undoped and $n^+$-type hydrogenated amorphous silicon films 104 and 105 have a back channel section 204 between the source and drain electrodes 107 and 106. The back channel section 204 is located to be opposed to the gate electrode 102. The $n^+$-type hydrogenated amorphous silicon film 105 has a high-resistance region 555 in the back channel section 204. The high-resistance region 555 is doped with phosphorus and boron, in other words, n- and p-type impurities. This region 555 may be called as a phosphorus/boron mixed region.

A patterned borosilicate glass (BSG) film 109 is formed on the drain and source electrodes 106 and 107 to be contacted with the uncovered $n^+$-type amorphous silicon film 105. A patterned light-shielding film 120, which is made of a patterned chromium (Cr) film (150 nm thick), is formed on the BSG film 109 to cover the back channel section 204.

At the interface between the $n^+$-type amorphous silicon film 105 and the BSG film 109 in the back channel section 204, the phosphorus contained in the silicon film 105 and the boron contained in the BSG film 109 are mutually diffused. Thus, the phosphorus concentration in the silicon film 105 and the boron concentration in the BSG film 109 are lowered. In other words, the phosphorus and boron are mixed or compensated in each of the films 105 and 109. This results in that the silicon film 105 provides a highly-resistant phosphorus/boron mixed region 555 in the back channel section 204.

Next, a fabrication method of the thin-film transistor according to the third embodiment will be described with reference to FIGS. 14A to 14G.

Figure 14A:
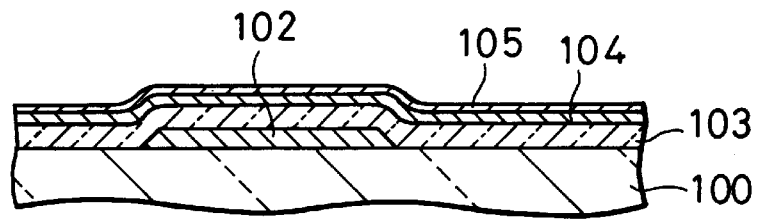
FIGS. 14A to 14G are partial cross-sectional views showing a fabrication process sequence of the thin-film transistor according to the third embodiment of FIG. 13, respectively.

As shown in FIG. 14A, after forming the gate electrode 102 on the substrate 100 by patterning the Cr film (200 nm thick), the silicon nitride film (350 nm thick) serving as the gate insulating film 103, the non-doped hydrogenated amorphous silicon film 104 (100 nm thick), and the phosphorus-doped, $n^+$-type amorphous silicon film 105 (10 nm thick) are successively deposited to be stacked on the substrate 100 by plasma CVD processes, respectively.

Figure 14B:
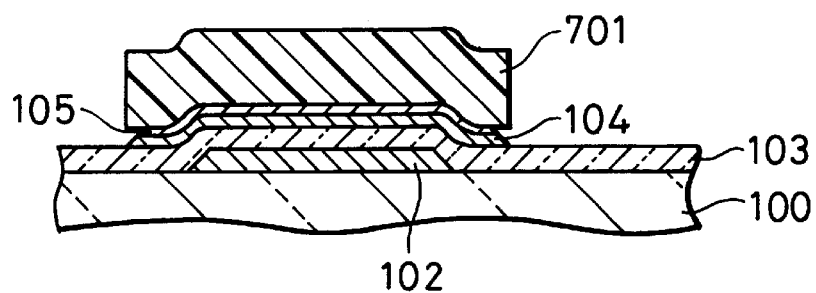

Next, as shown in FIG. 14B, a patterned photoresist film 701 is formed on the $n^+$-type amorphous silicon film 105. Then, using the photoresist film 701 as a mask, the two amorphous silicon films 104 and 105 are selectively removed by a dry etching process, resulting in an island-shaped stacked structure of the films 104 and 105. Thereafter, the photoresist film 701 is removed.

Figure 14C:
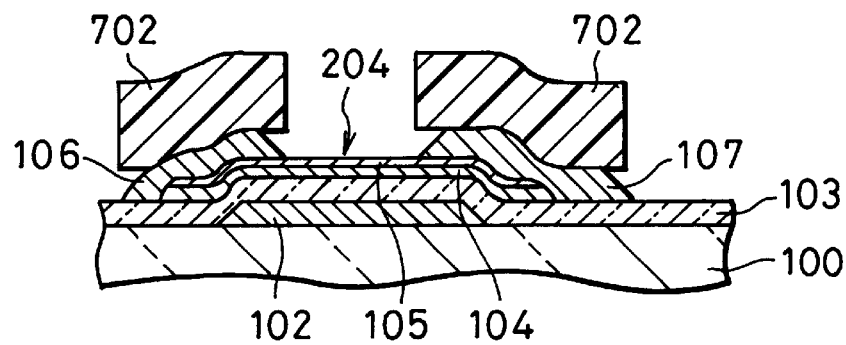

An aluminum film (400 nm thick) for the source and drain electrodes 107 and 106 is deposited by a sputtering process on the gate insulating film 103 to cover the island-shaped stacked structure. A patterned photoresist film 702 is formed on the aluminum film. The aluminum film is selectively removed by a wet etching process using the photoresist film 702 as a mask, thereby forming the source and drain electrodes 107 and 106, as shown in FIG. 14C.

At this stage, the $n^+$-type amorphous silicon film 105 is exposed from the source and drain electrodes 107 and 106 in the back channel section 204. The photoresist film 702 is then removed.

Figure 14D:
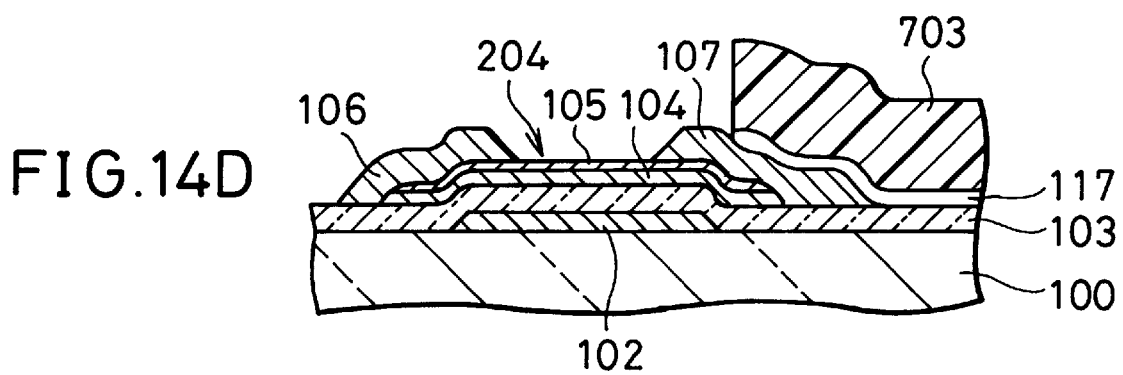

Next, an ITO film (150 nm thick) is formed by sputtering and then, is patterned to form the drain, source, and pixel electrodes 106, 107, and 117 using a patterned photoresist film 703, as shown in FIG. 14D. The photo resist film 703 is then removed.

Figure 14E:
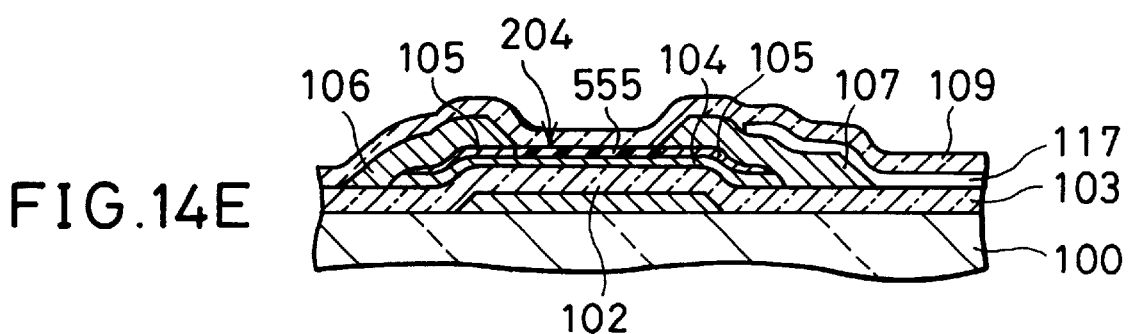

Subsequently, as shown in FIG. 14E, by using a plasma-CVD apparatus, the BSG film 109 (300 nm thick), which has a boron concentration of approximately $10^{21}$ cm$^{-3}$, is deposited to entirely cover the island-shaped transistor. The BSG film 109 is contacted with the uncovered $n^+$-type amorphous silicon film 105 in the back channel section 204.

In this formation process of the BSG film 109, the substrate 100 is set at a temperature of 280° C. A gaseous mixture of diborane ($B_2H_6$) (a boron hydride) and silane gases ($SiH_4$) is used as a reaction gas. This mixture has a mixing ratio $[B_2H_6/(SiH_4+B_2H_6)]$ is set at 25 mol %. An oxygen ($O_2$) gas is added to the mixture. A well-known plasma CVD method is employed.

Figure 14F:
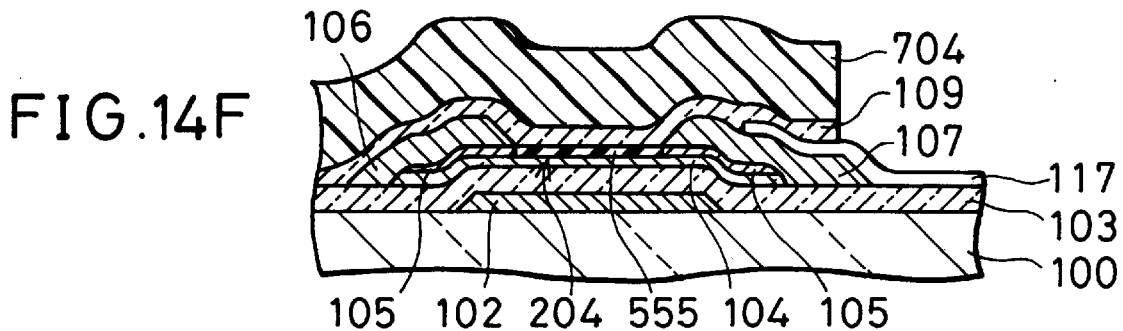

Further, a patterned photoresist film 704 is formed on the BSG film 109. Then, the BSG film 109 is patterned by etching to be selectively left, as shown in FIG. 14F. The remaining BSG film 109 serves as a protection film for the island-shaped thin-film transistor. The photoresist film 704 is then removed.

Figure 14G:
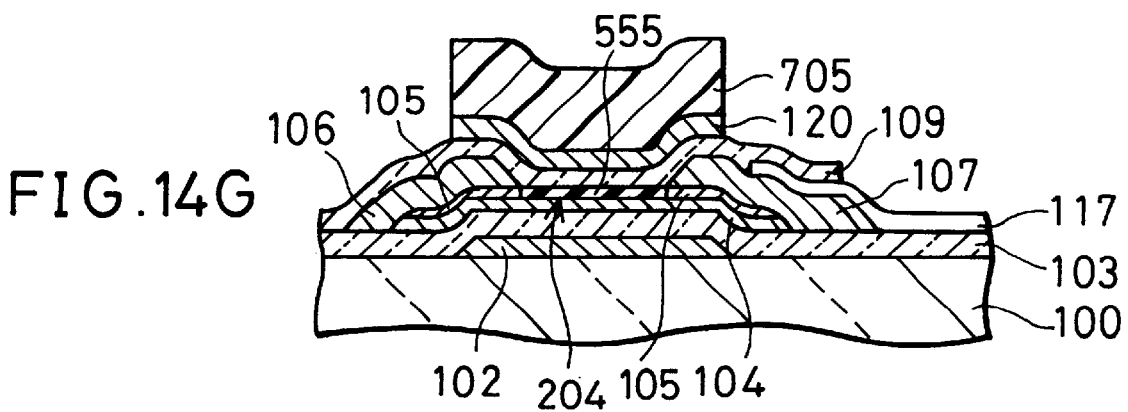

Further, as shown in FIG. 14G, a Cr film (200 nm thick) is deposited on the remaining BSG film (or, protection film) 109 by sputtering so as to cover the back channel section 204. Then, a patterned photoresist film 705 is formed to cover at least the back channel section 204. The Cr film is patterned to be selectively left over the island-shaped transistor using the photoresist film 705, resulting in a light-shielding film 120, as shown in FIG. 14G.

Through these processes, the phosphorus concentration and the boron concentration are lowered due to the mutual diffusion at the interface between the $n^+$-type amorphous silicon film 105 and the BSG film 109, but the reduction of the phosphorus and boron concentrations are compensated with each other in the respective films 105 and 109. This concentration reduction of the two dopants results in that the $n^+$-type amorphous silicon film 105 in the back channel section 204 provides the highly resistant phosphorus/boron compensated region 555.

This mutual diffusion can be positively produced by the thermal history in the process sequence of film formation by the plasma CVD technique and/or the individual heat treatment processes. To utilize the boron diffusion more effectively, the boron concentration in the BSG film 109 may be made excessive.

The function of the $n^+$-type amorphous silicon film 105 can be provided if this film 105 has a thickness of 10 nm or less. Therefore, the mutual diffusion can be utilized to form the phosphorus/boron mixed region 555. Due to the existence of the phosphorus/boron mixed region 555 with a high electric resistance, the characteristic of the thin-film transistor according to the third embodiment is substantially improved compared to the characteristic of a thin-film transistor where no phosphorus/boron region is formed in the back channel section 204.

For example, the conventional characteristic as shown with the curve "b" in FIG. 8 is changed into one as shown with the curve "d", which has a remarkable improvement in the off-characteristic.

In addition, because the popular techniques such as the plasma CVD technique and others are used, the process conditions can be set easily and a good reproducibility is provided. This results in a good yield and a stabilized operational characteristic over a long period of time, improving the operational reliability. This is because the back channel section 204 has a reduced phosphorus concentration and the concentration reduction is compensated with boron, thereby increasing the electric resistance.

The surface leakage current is low when compared to that for a conventional thin-film transistor where no high-resistance region is formed in the $n^+$-type amorphous silicon film.

Generally, a light-shielding film is provided in the back channel section and an interlayer insulating film is necessarily formed between the light-shielding film and the $n^+$-type amorphous silicon film. Therefore, if the BSG film 109 is provided as the interlayer insulating film, there is an additional advantage that no special structure nor special additional process are needed.

Even if a light-shielding film is not provided in the back channel section, a passivation protective film is often provided. Therefore, in this case, the BSG film 109 may be used as the passivation protective film.

A utilization example of a BSG film in a thin-film transistor is disclosed in the Japanese Non-Examined Patent Publication No. 1-276767 published in 1989. This example is shown in FIG. 6.

Figure 6:
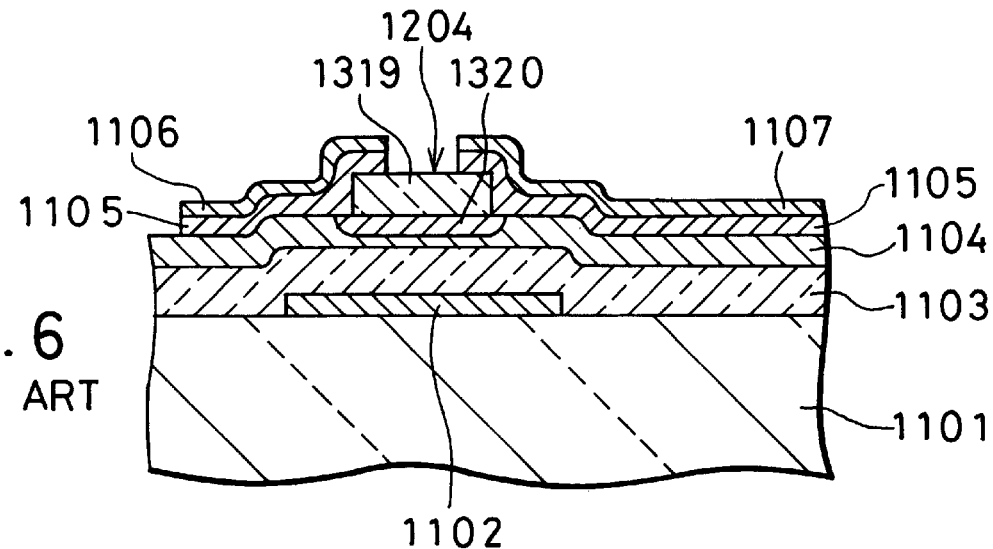
FIG. 6 is a partial cross-sectional view of a sixth conventional thin-film transistor.

As shown in FIG. 6, with the conventional thin-film transistor, a gate electrode 1102 is formed on an insulating substrate 1101. A gate insulating film 1103, an undoped hydrogenated amorphous silicon film 1104, and a silicate glass film 1319 are successively formed to be stacked on the substrate 1101 to cover the gate electrode 1102. The silicate glass film 1319 is patterned in such a way that the film 1319 is selectively left only in a back channel section 1204 to be opposite to the gate electrode 1102.

An $n^+$-type hydrogenated amorphous silicon film 1105 is formed on the undoped amorphous silicon film 1104. An electrically conductive film for drain and source electrodes is formed on the silicon film 1105. The $n^+$-type amorphous silicon film 1105 and the electrically conductive film are patterned to be the shape shown in FIG. 6, forming the drain and source electrodes 106 and 107 and exposing the top of the remaining silicate glass film 1319.

The doped impurity in the silicate glass film 1319 is diffused into the underlying amorphous silicon film 1104 in the back channel section 1204 by an annealing process, thereby forming an impurity-doped region 1320 in the film 1104. This region 1320 controls the mobility and the threshold voltage of the transistor. The Ohmic contact between the amorphous silicon film 1104 and the drain and source electrodes 1106 and 1107 does not degrade.

The $n^+$-type amorphous silicon film 1105 is not located in the back channel section 1204. The impurity-doped region 1320, the impurity of which is doped from the silicate glass film 1319, in the back channel section 1204 does not contain both of n- and p-type impurities.

With this thin-film transistor, the phosphorus/boron compensation function or action in the transistor according to the third embodiment of FIG. 13 is not utilized, but the threshold voltage is controlled by using one of the n- and p-type impurities. Accordingly, the sixth conventional thin-film transistor in FIG. 6 is quite different from the transistor according to the third embodiment of the present invention. Additionally, no statement suggesting the phosphorus/boron compensation function is disclosed in the Japanese Non-Examined Patent Publication No. 1-276767.

Another utilization example of a BSG film in a thin-film transistor is disclosed in the Japanese Non-Examined Patent Publication No. 4-6878 published in 1992. This example is shown in FIG. 7.

Figure 7:
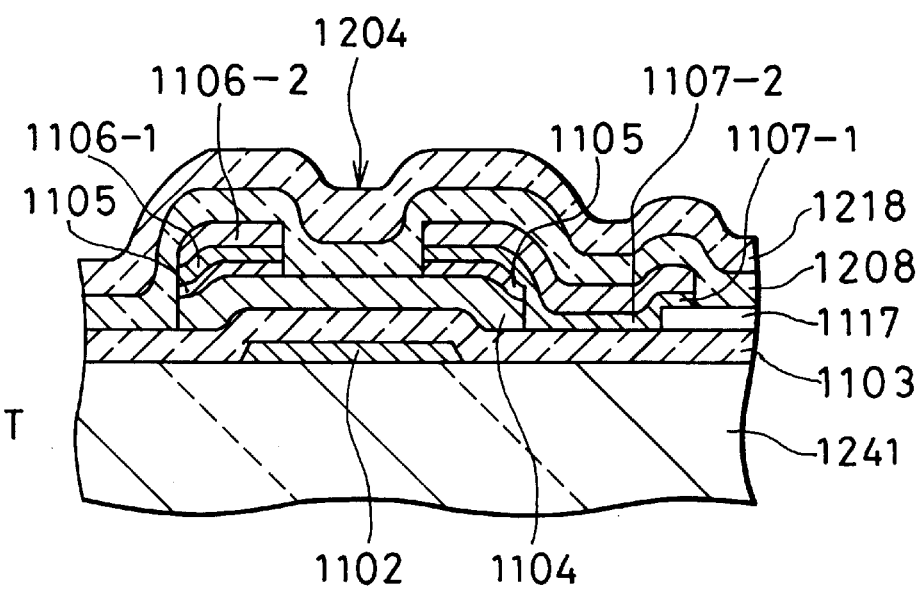
FIG. 7 is a partial cross-sectional view of a seventh conventional thin-film transistor.

As shown in FIG. 7, with the conventional thin-film transistor, a gate electrode 1102 is formed on a glass substrate 1241. A gate insulating film 1103 is formed on the substrate 1241 to cover the gate electrode 1102. A patterned, undoped hydrogenated amorphous silicon film 1104 is formed on the gate insulating film 1103 to be overlapped with the gate electrode 1102. A pixel electrode 1117 is formed on the gate insulating film 1103 apart from the gate electrode 1102.

A patterned, $n^+$-type hydrogenated amorphous silicon film 1105 is formed on the undoped amorphous silicon film 1104. Cr and Al films for drain and source electrodes are formed to be stacked on the silicon film 1105. These Cr and Al films are patterned to form lower and upper parts 1106-1 and 1106-2 of a drain electrode and lower and upper parts 1107-1 and 1107-2 of a source electrode, respectively. The lower part 1107-1 of the source electrode is contacted with the pixel electrode 117.

A BSG film 1208 is formed on the exposed gate insulating film 1203 to cover the transistor island. The BSG film 1208 is contacted with the undoped amorphous silicon film 1104 between the drain and source electrodes, or in the back channel section 1204. A $SiN_x$ film 1218 is formed on the BSG film 1208.

With this thin-film transistor in FIG. 7, the BSG film 1218 is used to prevent the surface energy level of the undoped amorphous silicon film 1104 from being raised due to the residues and contamination in the back channel section 1204. The $n^+$-type amorphous silicon film 1105 is not left in the back channel section 1204. Accordingly, the use of the BSG film 1208 in this conventional transistor in FIG. 7 is quite different from the present invention.

FOURTH EMBODIMENT

A fabrication method of a thin-film transistor according to a fourth embodiment will be described below with reference to FIGS. 15A to 15D. This method is a variation of the method according to the third embodiment, and the transistor to be fabricated is substantially the same in configuration as that of the third embodiment in FIG. 13. This method has an advantage that the number of the necessary processes is further shortened than the third embodiment.

Figure 15A:
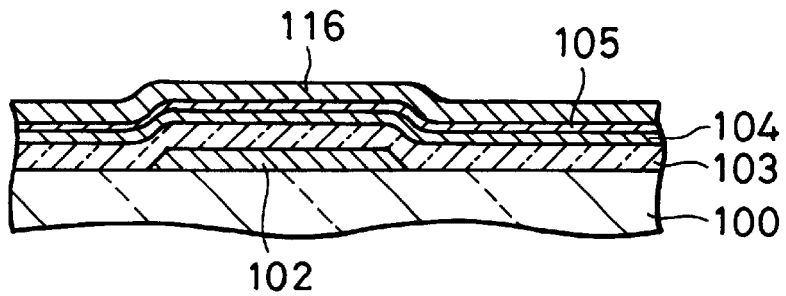
FIGS. 15A to 15D are partial cross-sectional views showing a fabrication process sequence of a thin-film transistor according to a fourth embodiment, respectively.

First, as shown in FIG. 15A, a first photolithography process is performed, in which a Cr film (200 nm thick) is patterned to form a gate electrode 102.

Next, a silicon nitride film (350 nm thick) serving as the gate insulating film 103, the non-doped hydrogenated amorphous silicon film 104 (100 nm thick), and the phosphorus-doped, $n^+$-type amorphous silicon film 105 (10 nm thick) are successively deposited to be stacked on the substrate 100 by plasma CVD processes, respectively. A Cr film (100 nm thick) 116 is deposited on the $n^+$-type amorphous silicon film 105 by a sputtering process.

Figure 15B:
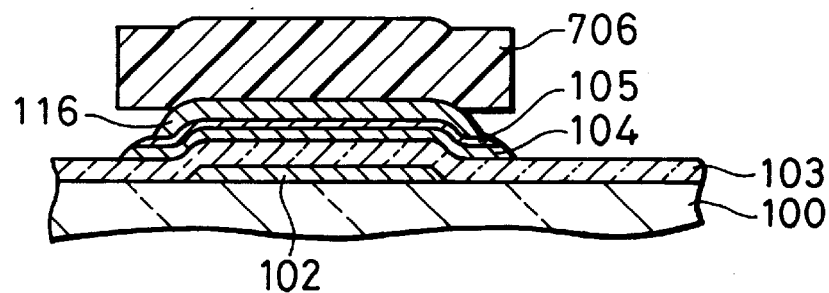

Next, a second photolithography process is performed, in which a patterned photoresist film 706 is formed on the Cr film 116, as shown in FIG. 15B. Then, using the photoresist film 706 as a mask, the Cr film 106 is selectively removed by a dry etching process. Thereafter, using the same photoresist film 706 as a mask, the two amorphous silicon films 104 and 105 are selectively removed by a dry etching process. Thus, an island-shaped stacked structure of the films 104, 105, and 116 are formed. Thereafter, the photoresist film 706 is removed.

Figure 15C:
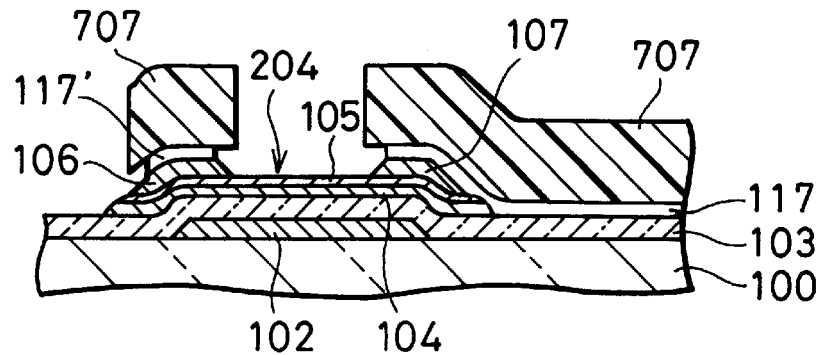

Next, an ITO film (200 nm thick) is formed by sputtering and then, a third photolithography process is carried out, in which a patterned photoresist film 707 is formed on the ITO film. The Cr film 116 and the ITO film are patterned to form the drain, source, and pixel electrodes 106, 107, and 117 using the photoresist film 707, as shown in FIG. 15C. The drain and source electrodes 106 and 107 are formed by the Cr film 117. The pixel electrode 117 is formed by the ITO film. The $n^+$-type amorphous silicon film 105 is exposed in the back channel section 204 through this etching process.

The reference numeral 117' in FIG. 15C indicates the remaining part of the ITO film. The photo resist film 707 is then removed.

Figure 15D:
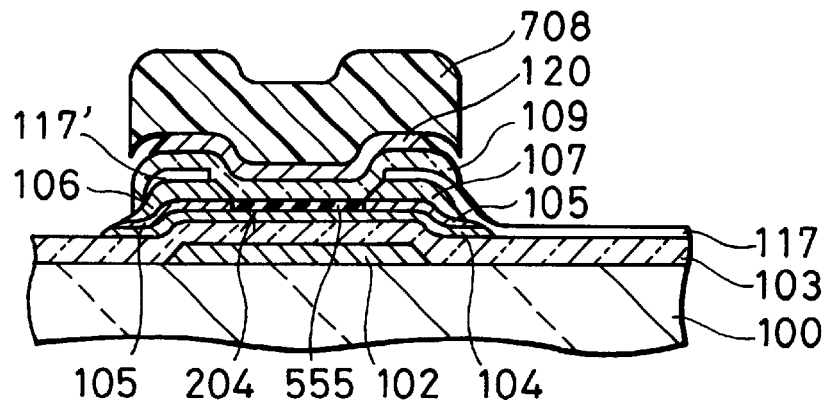

Subsequently, as shown in FIG. 15D, by using a plasma-CVD apparatus, the BSG film 109 (350 nm thick), which has a boron concentration of approximately $10^{22}$ cm$^{-3}$, is deposited to entirely cover the island-shaped transistor. The BSG film 109 is contacted with the uncovered $n^+$-type amorphous silicon film 105 in the back channel section 204.

In this formation process of the BSG film 109, the substrate 100 is set at a temperature of 270° C. A gaseous mixture of diborane ($B_2H_6$) and silane gases ($SiH_4$) is used as a reaction gas. This mixture has a mixing ratio [$B_2H_6$/ ($SiH_4$+$B_2H_6$)] is set at 30 mol %. An oxygen ($O_2$) gas is added to the mixture. A well-known plasma CVD method is employed.

Further, as shown in FIG. 15D, a Cr film (200 nm thick) is deposited on the remaining BSG film (or, protection film) 109 by sputtering so as to cover the back channel section 204.

Then, a fourth photolithography process is carried out, in which a patterned photoresist film 708 is formed to cover at least the back channel section 204. The Cr film is patterned by a dry etching process to be selectively left over the island-shaped transistor using the photoresist film 708 as a mask, resulting in the light-shielding film 120. Using the same photoresist film 708 as a mask, the BSG film 109 is patterned by a dry etching process to be selectively left over the island-shaped transistor. The state at this stage is shown in FIG. 15D. The photo resist film 708 is then removed.

Through these processes, the phosphorus concentration and the boron concentration are lowered due to the mutual diffusion at the interface between the $n^+$-type amorphous silicon film 105 and the BSG film 109, but the reduction of the phosphorus and boron concentrations are compensated with each other in the respective films 105 and 109. This concentration reduction of the two dopants results in that the $n^+$-type amorphous silicon film 105 in the back channel section 204 provides the highly resistant phosphorus/boron compensated region 555.

For example, the conventional characteristic as shown with the curve "b" in FIG. 8 is changed into one as shown with the curve "d", which has a remarkable improvement in the off-characteristic.

With the fabrication method of a thin-film transistor according to the fourth embodiment, the thin-film transistor is fabricated through "four" photolithography processes. On the other hand, with the fabrication method according to the third embodiment described by referring to FIGS. 14A to 14G, "six" photolithography processes are required in total, in which (1) patterning of the gate electrode 102, (2) patterning of the undoped and $n^+$-type amorphous silicon films 104 and 105, (3) patterning of the drain and source electrodes 106 and 107, (4) patterning of the pixel electrode 117, (5) patterning of the BSG film 109, and (6) patterning of the light-shielding film 120 are needed.

Accordingly, the method according to the fourth embodiment has a large advantage compared with the method according to the third embodiment.

Further, because there is no need for etching off the back channel section 204, no margin for film thickness is required for the undoped amorphous silicon film 104. This means that the film thickness can be designed to be minimum, resulting in a high productivity.

With the fabrication methods according to the third and fourth embodiments, the concentrations of the doped boron and phosphorus in the $n^+$-type amorphous silicon film 105 for Ohmic contact regions vary depend upon such factors as the phosphorus concentration and film thickness of the film 105 at the stage of formation, the boron concentration and film thickness, and heat treatment time of the BSG film 109.

Thus, properly setting of these factors can provide positive compensation and therefore, not only the transistor characteristics can be assured but also the fabrication yield and the operational reliability can be achieved with ease.

FIFTH EMBODIMENT

Figure 16:
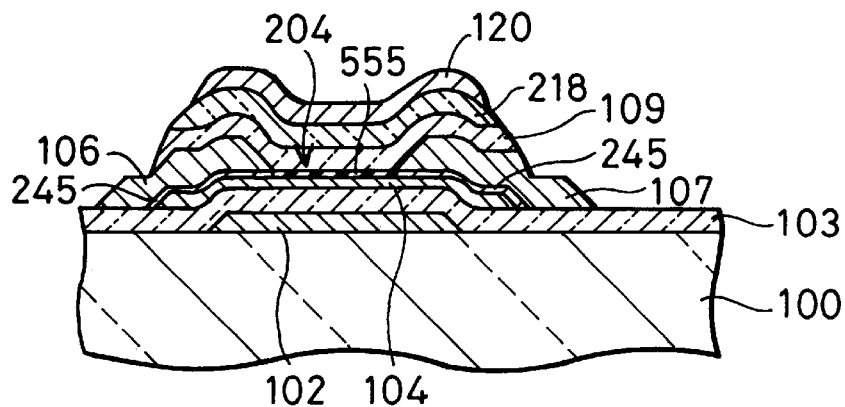
FIG. 16 is a partial cross-sectional view of a thin-film transistor according to a fifth embodiment of the present invention.

FIG. 16 shows a thin-film transistor of an inverted staggered type according to a fifth embodiment.

A gate electrode 102 is formed on a substrate 100 made of an aluminum silicate glass. The gate electrode 102 is formed by a patterned chromium (Cr) film (220 nm thick). A patterned silicon nitride ($SiN_x$) film (350 nm thick), which serves as a gate insulating film 103, is formed on the substrate 100 to cover the gate electrode 102. A patterned, undoped hydrogenated amorphous silicon film (30 nm thick) 104 is formed on the gate insulating film 103. The silicon film 104 is patterned to be an island to be opposed to (or, be overlapped with) the gate electrode 102.

A phosphorus-doped or an n-type region 245 is formed in the upper surface area of the amorphous silicon film 104. No $n^+$-type hydrogenated amorphous silicon film is provided.

A source electrode 107 and a drain electrode 106 are formed on the exposed gate insulating film 103 to be apart from each other. The source and drain electrodes 107 and 106 are contacted with the phosphorus-doped or n-type region 245 of the undoped amorphous silicon film 104. The source and drain electrodes 107 and 106 are formed by patterning a chromium (Cr) film (180 nm thick).

A patterned BSG film 109 and a patterned $SiN_x$ film 218 are formed over the transistor island to be overlapped with the drain and source electrodes 106 and 107 and the back channel section 204. A patterned light-shielding film 120, which is made of a patterned chromium (Cr) film (150 nm thick), is formed on the $SiN_x$ film 218 to cover the back channel section 204.

At the interface between the phosphorus-doped, n-type region 245 of the amorphous silicon film 104 and the BSG film 109 in the back channel section 204, the phosphorus contained in the n-type region 245 and the boron contained in the BSG film 109 are mutually diffused. Thus, the phosphorus concentration in the n-type region 245 and the boron concentration in the BSG film 109 are lowered. In other words, the phosphorus and boron are mixed or compensated in each of the region 245 and the BSG film 109. This results in that the n-type region 245 of the amorphous silicon film 104 provides a highly-resistant phosphorus/boron mixed region 555 in the back channel section 204.

Unlike the conventional thin-film transistor shown in FIG. 7, with the thin-film transistor according to the fifth embodiment, the phosphorus-doped region 245 is provided in the undoped amorphous silicon film 104 and the phosphorus/boron mixed region 555 is formed in the amorphous silicon film 104 in the back channel section 204. This is intended not only to compensate for the surface energy-level due to a mere protection and the surface contamination but also to provide a reliable compensation of the phosphorus in the phosphorus-doped region 245 with boron.

Further, with the conventional thin-film transistor shown in FIG. 6, the BSG film 1319 is used for controlling the threshold voltage. No phosphorus-doped region is located in the back channel section 204. On the other hand, with the transistor according to the fifth embodiment, the BSG film 109 is provided for diffusing the boron into the phosphorus-doped region 245.

Therefore, the transistor according to the fifth embodiment is quite different from the conventional transistors in FIGS. 6 and 7.

Next, a fabrication method of the thin-film transistor according to the fifth embodiment will be described with reference to FIGS. 17A to 17G.

Figure 17A:
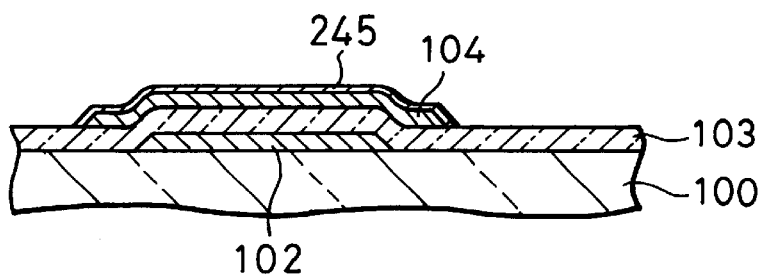
FIGS. 17A to 17C are partial cross-sectional views showing a fabrication process sequence of the thin-film transistor according to the fifth embodiment of FIG. 16, respectively.

First, as shown in FIG. 17A, a first photolithography process is performed, in which a Cr film is patterned to form the gate electrode 102.

Next, a silicon nitride film (320 nm thick) serving as the gate insulating film 103, the non-doped hydrogenated amorphous silicon film 104 (25 nm thick) are successively deposited to be stacked on the substrate 100 by plasma CVD processes, respectively.

A second photolithography process is performed, in which a patterned photoresist film (not shown) is formed on the non-doped amorphous silicon film 104. Then, using the photoresist film as a mask, the silicon film 104 is selectively removed by a dry etching process to have an island-shaped transistor.

Thereafter, the surface of the remaining amorphous silicon film 104 is exposed to phosphine plasma. This process is performed by using a sputtering apparatus to be used for forming an electrically conductive film (i.e., Cr film) for the source and drain electrodes 107 and 106 in a later process.

In this exposing process of the silicon film 104, the substrate 100 is set as a temperature of 300° C. As a reaction gas, a gaseous mixture of an argon (Ar) gas and a 0.5%-phosphine ($PH_3$) gas is used. The reaction gas is continuously pumped so that the gas pressure in the reaction chamber is held at 15 Pa. The phosphine plasma is generated by exciting the reaction gas with a high-frequency electric power of 0.2 $W/cm^2$ at a frequency of 13.56 MHz. The silicon film 104 is exposed to the phosphine plasma for two minutes, thereby doping selectively the phosphorus contained in the reaction gas into the film 104. Thus, the n-type region 245 is formed in the upper surface area of the undoped silicon film 104.

This exposure process may be achieved by use of a special plasma doping apparatus. However, if it is performed in a plasma CVD apparatus to be used subsequently, not only the electrically conductive film (for example, a Cr film) can be formed successively but also a better Ohmic contact can be easily realized.

Figure 17B:
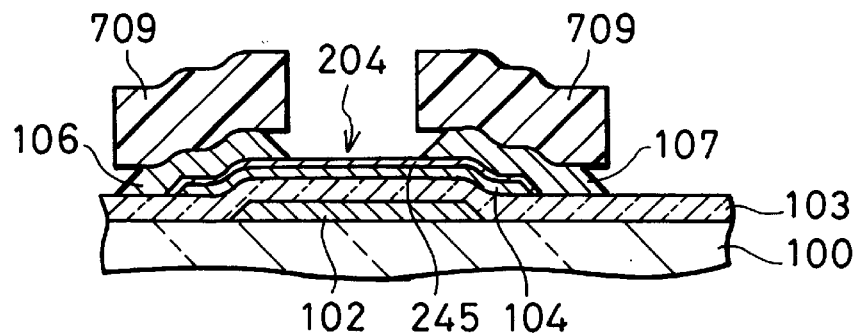

Next, a Cr film (200 nm thick) is formed by sputtering and then, a third photolithography process is carried out, in which a patterned photoresist film 709 is formed on the Cr film. The Cr film is then patterned to form the drain and source electrodes 106 and 107 using the photoresist film 709, as shown in FIG. 17B. The n-type region 245 is exposed in the back channel section 204 through this etching process. The photo resist film 709 is then removed.

Figure 17C:
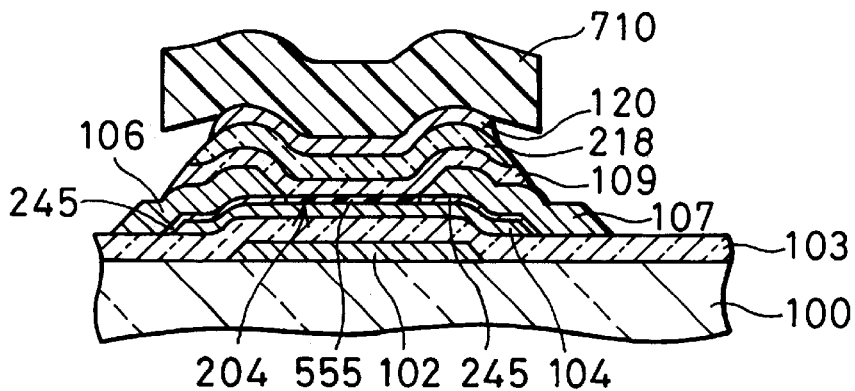

Subsequently, as shown in FIG. 17C, by using a plasma-CVD apparatus, the BSG film 109 (150 nm thick), which has a boron concentration of approximately $10^{20}$ $cm^{-3}$ in the film and of approximately $10^{22}$ $cm^{-3}$ in the surface is deposited to entirely cover the island-shaped transistor. The BSG film 109 is contacted with the uncovered n-type region 245 of the undoped amorphous silicon film 104 in the back channel section 204.

In this formation process of the BSG film 109, the substrate 100 is set at a temperature of 260° C. A gaseous mixture of diborane ($B_2H_6$) and silane gases ($SiH_4$) is used as a reaction gas. This mixture has a mixing ratio [$B_2H_6$/($SiH_4+B_2H_6$)] is set at 35 mol % and then, set to 3 mol %. An oxygen ($O_2$) gas is added to the mixture. A well-known plasma CVD method is employed.

Further, as shown in FIG. 17C, the $SiN_x$ film (200 mm thick) 218 is deposited on the BSG film 109. A Cr film (150 nm thick) 120 is deposited on the $SiN_x$ film 216 by sputtering so as to cover the back channel section 204.

Then, a fourth photolithography process is carried out, in which a patterned photoresist film 710 is formed to cover at least the back channel section 204. The Cr film is patterned by a wet etching process with a suitable etchant to be selectively left over the island-shaped transistor using the photoresist film 710 as a mask, resulting in the light-shielding film 120.

Using the same photoresist film 710 as a mask, the SiN$_x$ film 218 is patterned by a wet etching process with a suitable etchant to be selectively left over the island-shaped transistor. Further, using the same photoresist film 710 as a mask, the BSG film 109 is patterned by a wet etching process with a suitable etchant to be selectively left over the island-shaped transistor. The state at this stage is shown in FIG. 17C. The photo resist film 710 is then removed.

Through these processes, the phosphorus concentration and the boron concentration are lowered due to the mutual diffusion at the interface between the n-type region 245 and the BSG film 109, but the reduction of the phosphorus and boron concentrations are compensated with each other therein. This concentration reduction of the two dopants results in that the n-type region 245 in the back channel section 204 provides the highly resistant phosphorus/boron compensated region 555.

This mutual diffusion can be positively produced by the thermal history in the process sequence of film formation by the plasma CVD technique and/or the individual heat treatment processes. To utilize the mutual diffusion, it is desirable that the BSG film 109 be one formed by a plasma CVD method, because the hydrogen promotes the diffusion. The boron concentration in the BSG film 109 may be made stoichiometrically excessive.

Because the phosphorus doped region 245 may be formed to have a thickness of 20 nm or less (preferably, to approximately 5 nm), the mutual diffusion of phosphorus and boron can be made sufficiently.

Compared to the characteristic of a thin-film transistor in which a phosphorus doped layer is provided in the back channel section, but no boron diffusion is caused (no phosphorus/boron region is given), the characteristic is remarkably improved.

For example, the conventional characteristic as shown with the curve "b" in FIG. 8 is changed into one as shown with the curve "d", which leads to a substantial improvement in the off-characteristic.

In addition, since the reproducibility is good, a good fabrication yield and the stabilized characteristic over a long period of time is obtained, which improves the operational reliability. This is because the back channel section has a reduced phosphorus concentration and this reduction is compensated with boron, thereby increasing the electrical resistance.

The surface leakage current is low when compared to that for a conventional thin-film transistor where no boron-doped region is formed in the phosphorus-doped silicon film.

Generally, as the interlayer insulating film for the light-shielding film 120, the BSG film 109 is provided in the back channel section 204. Therefore, there is an additional advantage that no special structure nor special additional process are needed. Further, since the BSG and SiN$_x$ films are provided, the protection function has an increased reliability and the long-term reliability is improved.

With the fabrication method according to the fifth embodiment, the thin-film transistor is fabricated through four photolithography processes. This simple method that completes a thin-film transistor including a light-shielding film offers a large industrial advantage.

The method according to the fifth embodiment is different from that of the conventional transistor in FIG. 7 in that a process of forming the phosphorus-doped region 245 is included.

To form the phosphorus-doped region 245 for Ohmic contact in the inverted staggered type thin-film transistor, the PH$_3$ plasma is used in this embodiment. Thus, the undoped amorphous silicon film 104 to be contacted with the source and drain electrodes 107 and 106 can be directly doped with phosphorus. As a result, the doping effect is enhanced, in other words, the concentration of phosphorus in the phosphorus-doped region 245 can be made comparatively low. Consequently, the direct doping of boron into the region 245 using the B$_2$H$_6$ plasma can be easily realized.

SIXTH EMBODIMENT

Figure 18:
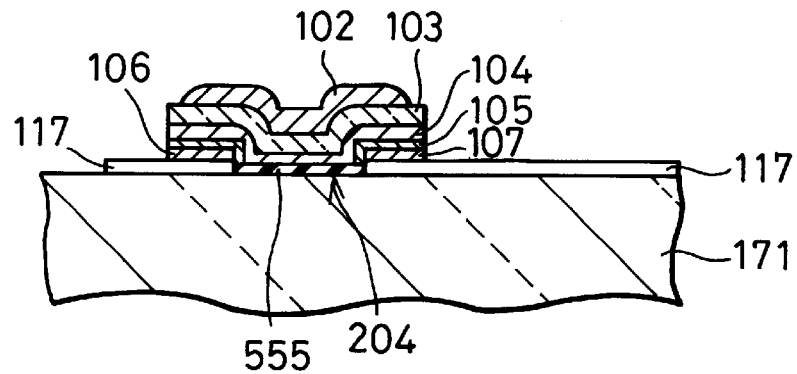
FIG. 18 is a partial cross-sectional view of a thin-film transistor according to a sixth embodiment of the present invention.

FIG. 18 shows a thin-film transistor according to a sixth embodiment, which is of a staggered type.

In FIG. 18, pixel electrodes 117 are formed on a BSG substrate 171. A source electrode 107 and a drain electrode 106 are formed on the pixel electrodes 117, respectively. A patterned, n$^+$-type hydrogenated amorphous silicon film 105, which is doped with phosphorus, is formed on the pixel electrodes 117 to be contacted with the BSG substrate 171 between the source and drain electrodes 107 and 106. A patterned, undoped hydrogenated amorphous silicon film 104 is formed on the n$^+$-type amorphous silicon film 105. A patterned gate insulating film 103 is formed on the undoped amorphous silicon film 104. A gate electrode 102 is formed on the gate insulating film 103.

A high-resistance region, i.e., a phosphorus/boron mixed region 555 is formed in the n$^+$-type amorphous silicon film 105 in a back channel section 204.

The substrate 171 may be made of any material in the borosilicate-system glasses such as a borosilicate glass, and aluminum borosilicate glass, each of which contains boron.

A fabrication method of the transistor according to the sixth embodiment is explained below.

Figure 19:
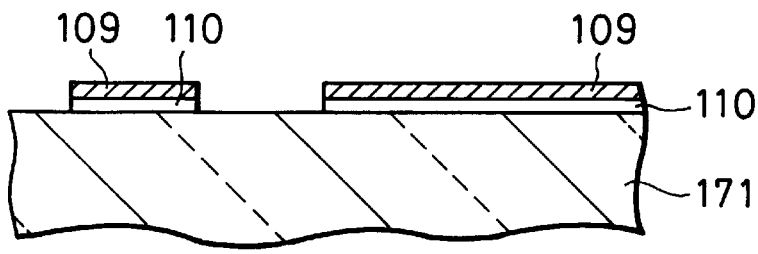
FIG. 19 is a partial cross-sectional view showing a fabrication process sequence of the thin-film transistor according to the sixth embodiment of FIG. 18.

First, as shown in FIG. 19, an ITO film (150 nm thick) 110 is deposited on the BSG substrate 171. A Cr film (100 nm thick) 109 for the source and drain electrodes is deposited on the ITO film 110.

Next, the ITO and Cr films 110 and 109 are patterned to be selectively removed, thereby exposing the substrate 171 from the ITO and Cr films 110 and 109 at a location corresponding to the back channel section 204, as shown in FIG. 19. The patterned ITO film 110 constitute the pixel electrodes 117.

Further, the n$^+$-type hydrogenated amorphous silicon film (3 nm thick) 105, the undoped hydrogenated amorphous silicon film (15 nm thick) 104, the SiN$_x$ film (250 nm thick) 103, and the Cr film (250 nm thick) 102 are formed to be stacked on the patterned Cr film 109 and the exposed substrate 171.

Then, the Cr film 102 is patterned to be the gate electrode. Following this, the SiN$_x$ film 103, the undoped amorphous silicon film 104, and the n$^+$-type amorphous silicon film 105 are patterned using the same mask as that for the Cr film 102. Thus, the drain and source electrodes 106 and 107 and a transistor island are formed, as shown in FIG. 18.

The boron contained in the substrate 171 is diffused into the n$^+$-type amorphous silicon film 105 in the back channel section 204, resulting in the phosphorus/boron mixed region 555 in the film 105.

Figure 2:
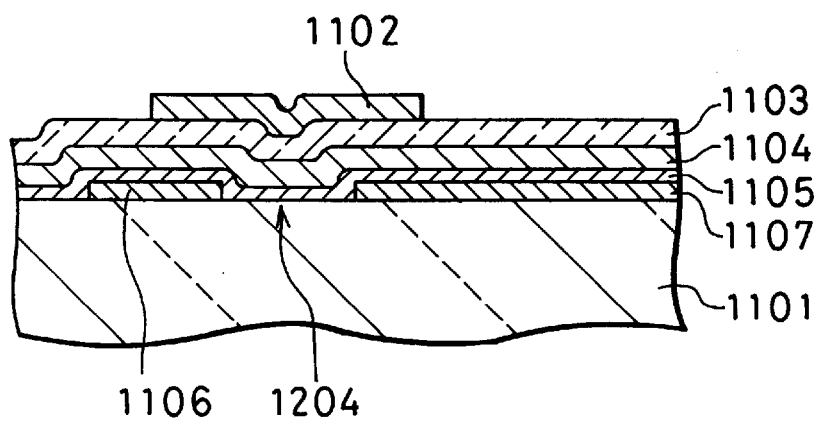
FIG. 2 is a partial cross-sectional view of a second conventional thin-film transistor.

Therefore, the source electrode 107 and the drain electrode 106 are provided with good Ohmic contacts with the n$^+$-type amorphous silicon film 105. The phosphorus in the silicon film 105 is compensated by boron diffused from the BSG substrate 171 in the phosphorus/boron mixed region 555, thereby increasing the electric resistance. Thus, compared to the characteristic of the conventional thin-film transistor as shown in FIG. 2, the characteristic is drastically improved.

For example, the conventional characteristic as shown with the curve "b" in FIG. 8, in which a fault is often caused in the off-characteristic, is changed into one as shown with the curve "d". This minimizes the leakage current in the off-characteristic, resulting in an improved yield. Further, the reproducibility is good and the characteristic is stabilized over a long period of time, improving the reliability.

Generally, as the substrate, an insulating, transparent glass substrate is used. The insulating properties are required for prevention of short-circuit between wiring lines. The transparency is for assuring the light transmission for a transmission type LCD. The glass material is selected because it is a low-cost material that can withstand the fabrication process temperature. To prevent contamination due to sodium (Na) ions, a glass substrate having a low sodium content may be selected.

A variety of substrates meeting these requirements are available. The former type includes those made of glasses ranging from soda-lime ones, and "soft glasses" in the lead (Pb) glass system to aluminum silicate ones, aluminum borosilicate ones, borosilicate ones, and "hard glasses" in the silica glass system. The latter type includes aluminum silicate glasses, borosilicate ones, and silica ones.

With the transistor according to the sixth embodiment, the BSG substrate 171 is selected not only to satisfy these requirements but also to dope boron into the $n^+$-type amorphous silicon film 105 in the back channel section 204 to compensate the previously-doped phosphorus in the simplified structure where the $n^+$-type amorphous silicon film 105 is located in the back channel section 204. It can be supposed that the doping of boron is caused by not only the thermal diffusion of boron from the BSG substrate 171 but also the sputtering of the substrate 171 by the plasma. The sputtering of the substrate 171 liberates or sputters the boron in the substrate 171 and the sputtered boron is entered the $n^+$-type amorphous silicon film 105.

Therefore, the feature of this sixth embodiment is that a BSG substrate made of a borosilicate glass or aluminum borosilicate glass containing boron by 10% to 50% among the above-stated substrate materials is used. Because the substrate 171 itself contains boron, there is an additional advantage that no additional material and processing are required for phosphorus/boron compensation.

SEVENTH EMBODIMENT

Figure 20:
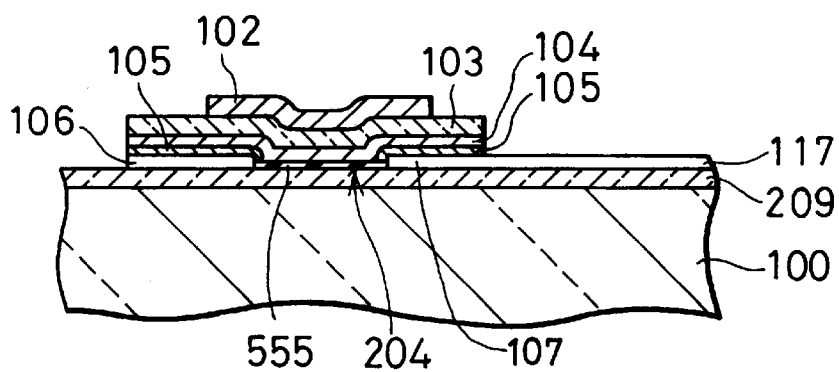
FIG. 20 is a partial cross-sectional view of a thin-film transistor according to a seventh embodiment of the present invention.

FIG. 20 shows a thin-film transistor according to a seventh embodiment, which is of a staggered type.

In FIG. 20, a BSG film 209 is formed on a substrate 100. A source electrode 107, a drain electrode 106, and a pixel electrode 117 are formed on the BSG film 209. The pixel electrode 117 is unified with the source electrode 107.

A patterned, $n^+$-type hydrogenated amorphous silicon film 105, which is doped with phosphorus, is formed on the drain, source, and pixel electrodes 106, 107, and 171 to be contacted with the substrate 100 between the source and drain electrodes 107 and 106. A patterned, undoped hydrogenated amorphous silicon film 104 is formed on the $n^+$-type amorphous silicon film 105. A patterned gate insulating film 103 is formed on the undoped amorphous silicon film 104. A gate electrode 102 is formed on the gate insulating film 103.

A high-resistance region, i.e., a phosphorus/boron mixed region 555 is formed in the $n^+$-type amorphous silicon film 105 in a back channel section 204.

A fabrication method of the transistor according to the seventh embodiment is explained below.

Figure 21A:
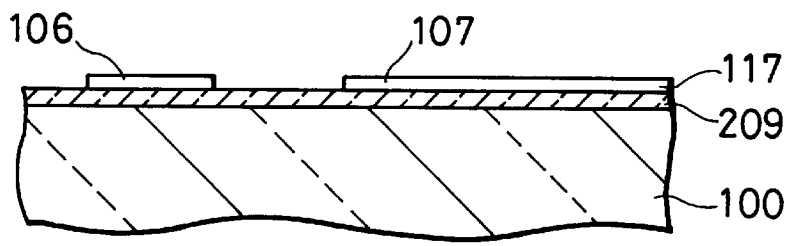
FIGS. 21A and 21B are partial cross-sectional views showing a fabrication process sequence of the thin-film transistor according to the seventh embodiment of FIG. 20, respectively.

First, as shown in FIG. 21A, the BSG film (350 nm thick) 209 is formed on the substrate 100 by a popular plasma CVD process. An ITO film (150 nm thick) is deposited on the BSG film 209 by a sputtering process.

Next, the ITO film is patterned to be selectively removed, thereby exposing the substrate 100 from the ITO film at a location corresponding to the back channel section 204, as shown in FIG. 21A. The patterned ITO film constitute the drain, source, and pixel electrodes 106, 107, and 117.

Figure 21B:
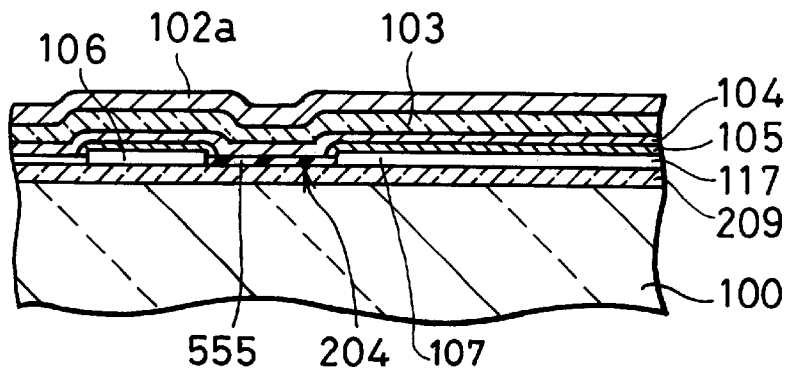

Further, the $n^+$-type hydrogenated amorphous silicon film (4 nm thick) 105, the undoped hydrogenated amorphous silicon film (30 nm thick) 104, the $SiN_x$ film (250 nm thick) 103 are successively formed by plasma CVD processes to be stacked on the drain and source electrodes 106 and 107 and the exposed substrate 171. A Mo film (150 nm thick) is formed on the $SiN_x$ film 103 by a sputtering process. The state at this stage is shown in FIG. 21B.

Following this, the $SiN_x$ film 103, the undoped amorphous silicon film 104, and the $n^+$-type amorphous silicon film 105 are patterned to have a same island shape. The Mo film is patterned to form the gate electrode 102 having a shape smaller than the island shape.

Thus, the transistor according to the seventh embodiment is obtained, as shown in FIG. 20.

The smaller size of the gate electrode 102 increases the distance between the gate electrode 102 and the source and drain electrodes 107 and 106 to prevent a leakage current from flowing therebetween.

The boron contained in the BSG film 209 is diffused into the $n^+$-type amorphous silicon film 105 in the back channel section 204 through the above process sequence, resulting in the phosphorus/boron mixed region 555 and the in the film 105. Therefore, the leakage current between the source and drain electrodes 107 and 106 is suppressed and as a result, the off-characteristic is improved.

The source electrode 107 and the drain electrode 106 are provided with good Ohmic contacts with the $n^+$-type amorphous silicon film 105.

The phosphorus in the silicon film 105 is compensated by boron diffused from the BSG substrate 171 in the phosphorus/boron mixed region 555, thereby increasing the electrical resistance. Thus, compared to the characteristic of the conventional thin-film transistor as shown in FIG. 2, the characteristic is drastically improved.

For example, the conventional characteristic as shown with the curve "a" in FIG. 8, in which a fault is often caused in the off-characteristic, is changed into one as shown with the curve "d".

A protection film provided on a glass substrate is generally intended to prevent the substrate from being contaminated with sodium (Na) ions or others, or to be used as an interlayer insulating film for the light-shielding film. In this seventh embodiment, the BSG film 209 is intended not only to meet these requirements but also to compensate the phosphorus doped into the $n^+$-type amorphous silicon film 105 with boron diffused from the BSG film 209.

To increase the amount of the diffused boron, a BSG film which is doped with stoichiometrically excessive boron may be used. Particularly, it is preferred that a BSG film formed by a plasma CVD method contains hydrogen and thus, this BSG film can easily be doped.

There is an additional advantage that the BSG film 209 provided on the substrate 100 need not be patterned by photolithography.

EIGHTH EMBODIMENT

Figure 22:
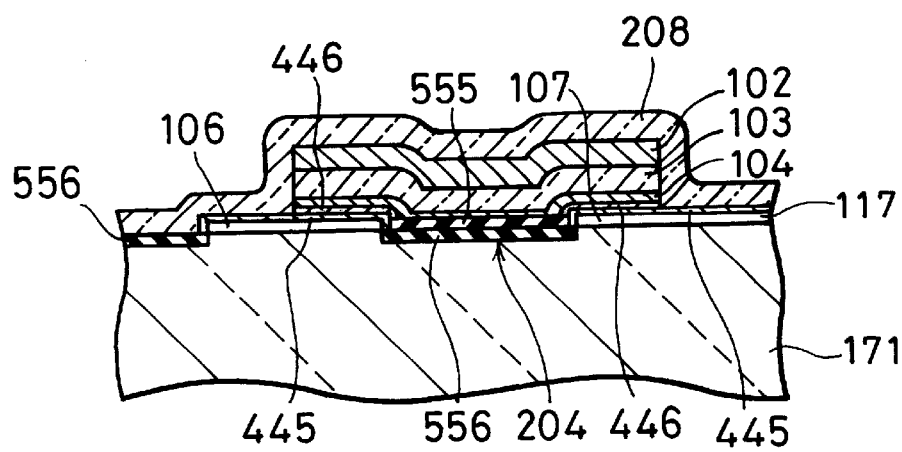
FIG. 22 is a partial cross-sectional view of a thin-film transistor according to an eighth embodiment of the present invention.

FIG. 22 shows a thin-film transistor according to an eighth embodiment, which is of a staggered type. This embodiment is a variation of the transistor according to the second embodiment in FIG. 11.

In FIG. 22, a source electrode 107, a drain electrode 106, and a pixel electrode 117 are formed on a BSG substrate 171. The source electrode 107 is unified with the pixel electrode 117.

On the source electrode 107, the drain electrode 106, and the area between these electrodes 107 and 106, a non-doped hydrogenated amorphous silicon film 104, a gate insulating film 103 made of a silicon nitride ($SiN_x$) film, a gate electrode 102 made of a molybdenum (Mo) film, and a protection film 208 made of BSG are formed to be stacked. The silicon film 104, the gate insulating film 103, and the gate electrode 102 are patterned to have a same island shape. The BSG film 208 is formed to cover the whole substrate 171.

The non-doped amorphous silicon film 104 is contacted with the BSG substrate 171 between the drain and source electrodes 106 and 107 or in the back channel section 204.

A phosphorus-doped region 445 is formed in the upper surface area of the drain electrode 106. Another phosphorus-doped region 445 is formed in the surface area of the source and pixel electrodes 107 and 117.

A pair of phosphorus-doped regions 446 and a phosphorus/boron mixed region 555 are formed in the lower surface area of the undoped amorphous silicon film 104. The pair of phosphorus-doped regions 446 are formed to be opposite to the drain and source electrodes 106 and 107, respectively. The pair of phosphorus-doped regions 446 serve as Ohmic contact regions for the drain and source electrodes 106 and 107.

The phosphorus/boron mixed region 555 in the undoped amorphous silicon film 104 is formed by plasma diffusion of boron and phosphorus that have been doped into the phosphorus/boron-doped region 556 of the BSG substrate 171 into the amorphous silicon film 104. Thus, not only Ohmic contact between the undoped amorphous silicon film 104 and the source and drain electrodes 107 and 106 is realized by the phosphorus-doped regions 446, but also the electric-resistance increase in the back channel section 204 is achieved by the phosphorus/boron mixed region 555.

The BSG substrate 171 may be made of any material in the borosilicate-system glasses including borosilicate glasses and aluminum borosilicate glasses, which contain boron.

Next, a fabrication method of the thin-film transistor according to the eighth embodiment is described.

First, a Ti film (100 nm thick) for the source and drain electrodes 107 and 106 are deposited on the BSG substrate 171. Then, the Ti film is selectively etched off to expose the substrate 171 between the source and drain electrodes 107 and 106.

Figure 23A:
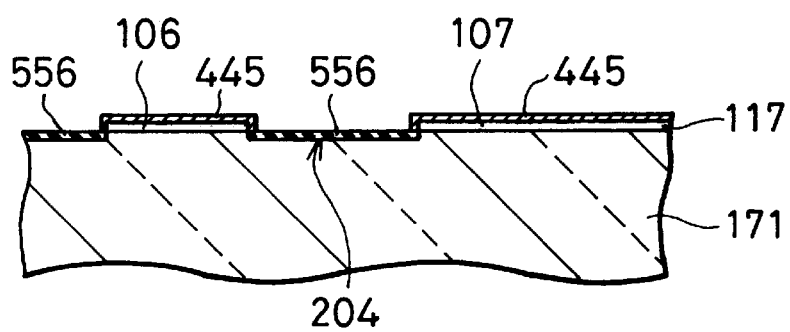
FIGS. 23A and 23B are partial cross-sectional views showing a fabrication process sequence of the thin-film transistor according to the eighth embodiment of FIG. 22, respectively.

Next, the surface of the Ti film and the uncovered substrate 171 are exposed to phosphine ($PH_3$) gas plasma to dope phosphorus (P) into the Ti film and the substrate 171, thereby forming the phosphorus-doped regions 445 in the Ti film and the phosphorus-doped regions 556 in the substrate 171. The state at this stage is shown in FIG. 23A.

The BSG substrate 171 itself contains boron and therefore, each of the phosphorus-doped regions 556 in the substrate 171 contains phosphorus and boron. Thus, it is preferred that these regions 556 should be termed the phosphorus/boron mixed regions.

This plasma doping process is performed using the same apparatus as that for the undoped amorphous silicon film 104. The substrate 171 is set at a temperature of 350° C. An argon (Ar) gas containing a phosphine ($PH_3$) gas by 0.5% is used as a reaction gas. The reaction gas is kept exhausted during the process so that the gas pressure in the reaction chamber is held at 10 Pa. $PH_3$ plasma is generated with a high-frequency electric power of 0.4 W/cm² at a frequency of 13.56 MHz. The exposure time of the substrate 171 and the Ti film to the plasma is 5 minutes.

This plasma doping process of the BSG substrate 171 and the Ti film may be achieved with the use of a special plasma doping apparatus. However, if this process is performed in any plasma CVD apparatus to be used in the subsequent processes, not only the semiconductor film (i.e., the non-doped amorphous silicon film 104) for which the phosphorus-doped regions 446 must be formed to provide Ohmic contacts with the source and drain electrodes 107 and 106 can be formed successively but also a better Ohmic contact can easily be given.

Figure 23B:
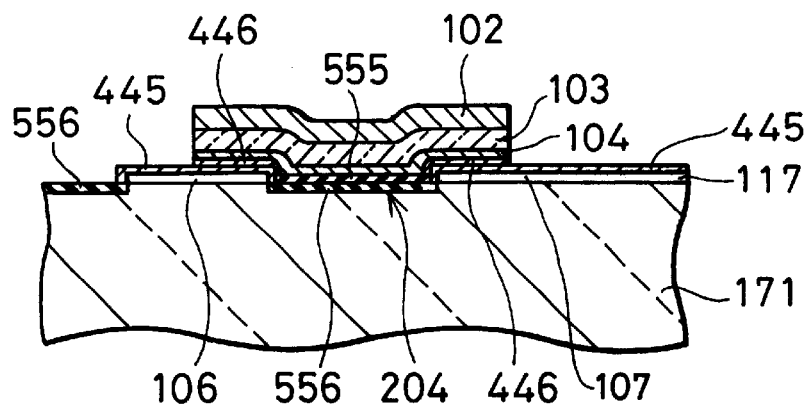

Next, as shown in FIG. 23B, the non-doped hydrogenated amorphous silicon film (17 nm thick) 104 and the silicon nitride ($SiN_x$) film (280 nm thick) for gate insulating film 103 are formed by plasma CVD processes to be stacked on the drain and source electrodes 106 and 107. A chromium (Cr) film (200 nm thick) for the gate electrode 102 is formed on the silicon nitride film 103 by a sputtering process.

Then, the Cr film is patterned to be the gate electrode 102 using a photoresist mask (not shown). Using the same photoresist mask, the non-doped hydrogenated amorphous silicon film 104 and the $SiN_x$ film are successively patterned by dry etching processes to have a same island shape, as shown in FIG. 23B. Thus, the thin-film transistor according to the eighth embodiment is completed.

Through the subsequent processes, the boron and phosphorus contained in the phosphorus/boron mixed region 556 of the substrate 171 is diffused into the opposing areas of the undoped amorphous silicon film 104. Thus, the boron/phosphorus mixed region 555 with a high electric resistance is formed in the back channel section 204.

At the same time, the phosphorus contained in the phosphorus-doped regions 445 of the source and drain electrodes 107 and 106 is diffused into the opposing areas of the undoped amorphous silicon film 104. Thus, the phosphorus-doped, Ohmic contact regions 446 are formed in the undoped amorphous silicon film 104.

Further, the BSG film 208 is deposited on the gate electrode 102 by a plasma CVD process to form a surface protection film, as shown in FIG. 22. The side walls of the transistor island from the gate electrode 102 to the source and drain electrodes 107 and 106 are protected with the BSG film 208 and consequently, a leakage current due to contamination is prevented from flowing. Therefore, compared to the characteristic of the third conventional thin-film transistor as shown in FIG. 3, the characteristic is drastically improved.

For example, the yield has conventionally been poor due to the unsatisfactory off-characteristic as shown with the curve "a" in FIG. 8. However, the characteristic has been improved to that as shown with the curve "d", where the leakage current in the off-characteristic region is eliminated, resulting in an improvement in fabrication yield. Further, the reproducibility is good, and the characteristic is stabilized over a long period of time with the reliability improved.

NINTH EMBODIMENT

Figure 24:
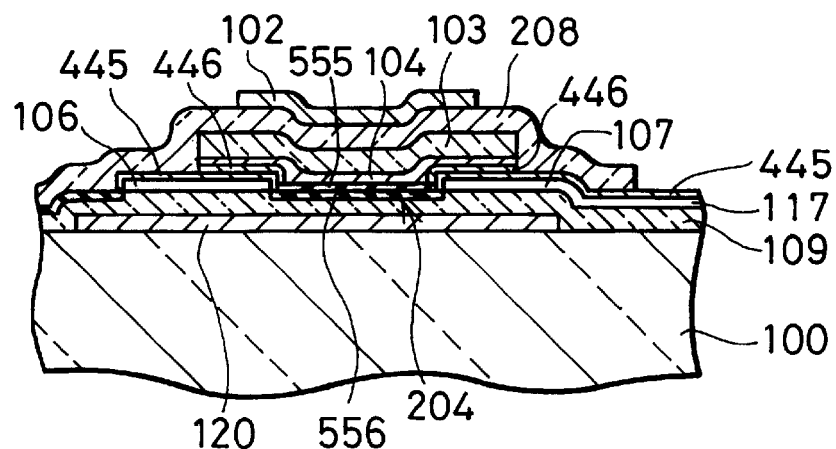
FIG. 24 is a partial cross-sectional view of a thin-film transistor according to a ninth embodiment of the present invention.

FIG. 24 shows a thin-film transistor according to a ninth embodiment, which is of a staggered type. This embodiment is another variation of the transistor according to the second embodiment in FIG. 11.

In FIG. 24, a light-shielding film 120 is formed on a substrate 100. A BSG film 109 is formed on the substrate 100 to cover the light-shielding film 120. A source electrode 107 and a drain electrode 106 are formed on the BSG film 109 to be opposite to the light-shielding film 120.

On the source electrode 107, the drain electrode 106, and the area between these electrodes 107 and 106, a non-doped hydrogenated amorphous silicon film 104 and a gate insulating film 103 made of a silicon nitride (SiN$_x$) film are formed to be stacked. The silicon film 104 and the gate insulating film 103 are patterned to have a same island shape. The non-doped amorphous silicon film 104 is contacted with the BSG film 109 between the drain and source electrodes 106 and 107 or in the back channel section 204.

A BSG film 208 is formed to cover the whole transistor island. A gate electrode 102 is formed on the BSG film 208 on the top of the island. The BSG film 208 serves as an additional gate insulating film.

A phosphorus-doped region 445 is formed in the upper surface area of the drain electrode 106. Another phosphorus-doped region 445 is formed in the surface area of the source and pixel electrodes 107 and 117.

A pair of phosphorus-doped regions 446 and a phosphorus/boron mixed region 555 are formed in the lower surface area of the undoped amorphous silicon film 104. The pair of phosphorus-doped regions 446 are formed to be opposite to the drain and source electrodes 106 and 107, respectively. The pair of phosphorus-doped regions 446 serve as Ohmic contact regions for the drain and source electrodes 106 and 107.

The phosphorus/boron mixed region 555 in the undoped amorphous silicon film 104 is formed by plasma diffusion of boron and phosphorus that have been doped into the phosphorus/boron-doped region 556 of the BSG substrate 171 into the amorphous silicon film 104. Thus, not only Ohmic contact between the undoped amorphous silicon film 104 and the source and drain electrodes 107 and 106 is realized by the phosphorus-doped regions 446, but also the electrical resistance increases in the back channel section 204 is achieved by the phosphorus/boron mixed region 555.

Next, a fabrication method of the thin-film transistor according to the ninth embodiment is described.

First, a Cr film (180 nm thick) is deposited on the electrically insulating, transparent glass substrate 100 by a sputtering process. The Cr film is patterned to form the light-shielding film 120.

Next, the BSG film (300 nm thick) 109 is deposited on the substrate 100 to cover the light-shielding film 120. A Cr film (150 nm thick) is deposited by a sputtering process on the BSG film 109. The Cr film is then patterned to form the drain, source, and pixel electrodes 107, 106, and 117 on the BSG substrate 109, exposing BSG film 109 between the source and drain electrodes 107 and 106.

Figure 25A:
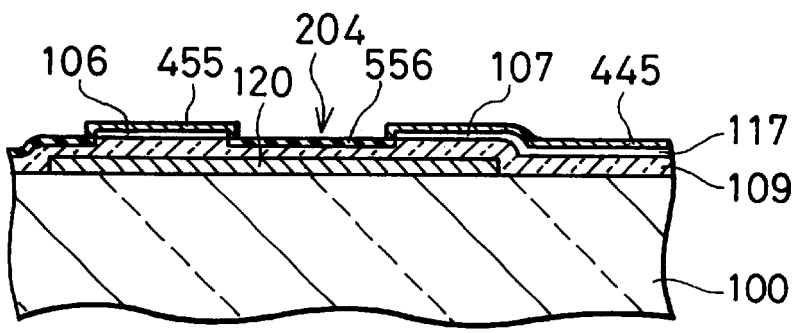
FIGS. 25A and 25B are partial cross-sectional views showing a fabrication process sequence of the thin-film transistor according to the ninth embodiment of FIG. 24, respectively.

Next, the drain, source, and pixel electrodes 106, 107, and 117 and the uncovered substrate BSG film 109 are exposed to phosphine (PH$_3$) gas plasma to dope phosphorus (P) thereinto. Thus, the phosphorus-doped regions 445 are formed in the Cr film and the phosphorus-doped region 556 is formed in the BSG film 109. The state at this stage is shown in FIG. 25A.

This plasma doping process is performed using a same plasma CVD apparatus as that for the undoped amorphous silicon film 104. The substrate 100 is set at a temperature of 300° C. An argon (Ar) gas containing a phosphine (PH$_3$) gas by 0.5% is used as a reaction gas. The reaction gas is kept exhausted during the process so that the gas pressure in the reaction chamber is held at 8 Pa. PH$_3$ plasma is generated with a high-frequency electric power of 0.3 W/cm$^2$ at a frequency of 13.56 MHz. The exposure time of the substrate 171 and the Ti film to the plasma is at least two minutes.

If this plasma doping process is performed in a plasma CVD apparatus for forming the non-doped silicon film 104, the phosphorus diffused regions 445 can easily be formed in the non-doped amorphous silicon film 104 to provide good Ohmic contact with the source and drain electrodes 107 and 106.

Figure 25B:
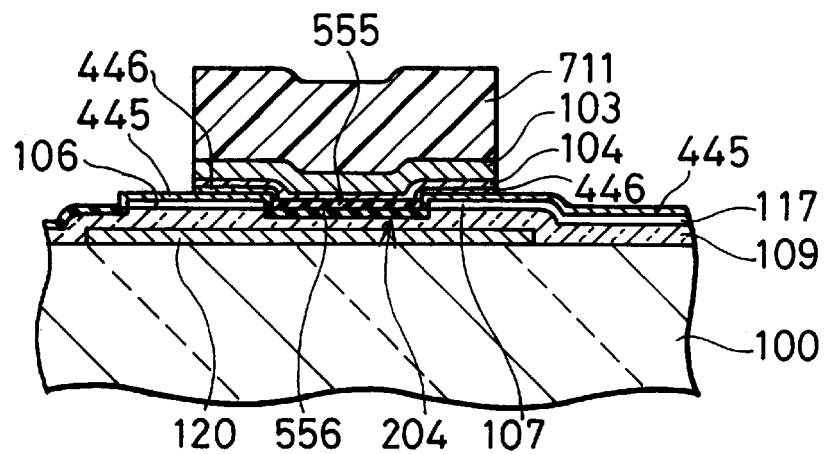

Next, as shown in FIG. 25B, the non-doped hydrogenated amorphous silicon film (16 nm thick) 104 and the silicon nitride (SiN$_x$) film (300 nm thick) for the gate insulating film 103 are formed by plasma CVD processes to be stacked on the drain and source electrodes 106 and 107. After forming a patterned photoresist film 711 on the gate insulating film 103, the two stacked films are selectively removed by a dry etching process or processes. The photoresist film 711 is then removed.

Further, the BSG film 208 (300 nm thick) is deposited to cover the transistor island by a plasma CVD process. The BSG film 208 is then patterned by an etching process.

Then, the Cr film (200 nm thick) is deposited on the BSG film 208 by a sputtering process. The Cr film is then patterned to form the gate electrode 102.

Through the series of these processes, the boron and phosphorus contained in the phosphorus/boron mixed region 556 of the substrate 171 is diffused into the opposing areas of the undoped amorphous silicon film 104. Thus, the boron/phosphorus mixed region 555 with a high electric resistance is formed in the back channel section 204.

At the same time, the phosphorus contained in the phosphorus-doped regions 445 of the source and drain electrodes 107 and 106 is diffused into the opposing areas of the undoped amorphous silicon film 104. Thus, the phosphorus-doped, Ohmic contact regions 446 are formed in the undoped amorphous silicon film 104.

In addition, the side walls of the transistor island from the gate electrode 102 to the source and drain electrodes 107 and 106 are protected with the BSG film 208. This prevents a leakage current due to contamination. Further, because the BSG film 208 is used with the gate insulating film 103, this thin-film transistor is prevented from having defects such as pinholes. Thus, the redundancy allowing the gate leakage current to be prevented is provided. Therefore, compared to the characteristic of the third conventional thin-film transistor as shown in FIG. 3, the characteristic is remarkably improved.

For example, although the yield has conventionally been poor due to the unsatisfactory off-characteristic as shown with the curve "a" in FIG. 8, the characteristic has been improved to that as shown with the curve "d", where the leakage current in the off-characteristic region is eliminated. This results in an improvement in yield.

Further, the reproducibility is good, and the characteristic is stabilized over a long period of time with the reliability improved.

With the above third, fourth, and fifth embodiments, the BSG film 109 is formed by the plasma CVD process using gaseous diborane and silane. However, instead of diborane, trimethyl boron or other organic material may be used, or boron tribromide may be introduced while being bubbled with carrier gas. In addition, by properly adjusting the conditions for forming a BSG film to the phosphorus concentration, the boron concentration at the interface of the BSG film and that in this film can be set so that the leakage current is eliminated and the electric resistance can be increased.

The following describe permutations of features for the present invention.

To provide Ohmic contact, two ways are available: use of an n$^+$-type amorphous silicon film and that of a phosphorus-doped region or film. To compensate the n-type impurity with a p-type impurity, two ways are available: plasma doping of boron and use of BSG. Further, two transistor types are available: non-inverted and inverted staggered. Therefore, eight different combinations are available in total.

(1) First, when "boron plasma doping" is used to compensate an n$^+$-type amorphous silicon film; with the inverted staggered type, direct boron doping using plasma containing a boron hydride gas such as diborane (B$_2$H$_6$) can produce a phosphorus/boron mixed region in the n$^+$-type amorphous silicon film in the back channel section. Thus, the phosphorus is compensated or canceled with boron thereby increasing the electric resistance in the phosphorus/boron mixed region. As a result, the leakage current is suppressed to a minimum.

With the non-inverted staggered type, by doping boron into the base SiO$_x$ film using plasma containing a boron hydride gas such as B$_2$H$_6$, the n$^+$-type amorphous silicon film, which is later deposited thereon in the back channel section, can produce indirectly a phosphorus/boron mixed region in the n$^+$-type amorphous silicon film in the back channel section by diffusion. Thus, the phosphorus can be compensated with boron. Therefore, as is the case with the inverted staggered type, the electric resistance in the phosphorus/boron mixed region can be increased to keep the leakage current to a minimum.

(2) Second, when "boron plasma doping" is used to compensate a phosphorus doped region; with the inverted staggered type, a non-doped amorphous silicon film is exposed to a phosphorus-containing plasma such as PH$_3$ plasma to form a phosphorus doped region. Then, after forming source and drain electrodes, the phosphorus doped region is exposed to a boron-containing plasma such as B$_2$H$_6$ plasma.

With the non-inverted staggered type, the base film such as a SiO$_x$ film is exposed to a phosphorus-containing plasma and then, the source and drain electrodes are formed. Further, after the base film is exposed to a boron-containing plasma, the n$^+$-type amorphous silicon film is formed.

These two ways of the plasma boron doping can provide a reliable compensation or cancellation if the processing conditions are properly set. Therefore, not only the characteristics can be assured but also the yield and reliability can be achieved with ease.

The ion penetration depth obtained by plasma boron doping is shallower than that by ion implantation. However, it is unnecessary that an n$^+$-type amorphous silicon film and a phosphorus doped region is formed to be thick for Ohmic contact. Therefore, introduction of boron into the n$^+$-type amorphous silicon film and a phosphorus doped region with a thickness required for Ohmic contact is able to be realized utilizing the reaction or interaction with radicals and diffusion.

Moreover, when PH$_3$ plasma is used for forming a phosphorus doped region or layer for Ohmic contact in an inverted staggered type, phosphorus can be directly doped into an n$^+$-type amorphous silicon film. This enhances the doping effect. As a result, the doping concentration of phosphorus in the phosphorus doped region need not set as excessive. This decreases the possible ion damage to the phosphorus doped region.

(3) Third, when BSG is used for impurity compensation in an n$^+$-type amorphous silicon film; with the inverted staggered type, a BSG film contacting the back channel section is simply deposited. With the non-inverted staggered type, a BSG substrate or a base BSG film formed on a substrate is used.

(4) When BSG is used for impurity compensation in a phosphorus doped region; with the non-inverted staggered type, boron is doped from a BSG film or substrate into a phosphorus/boron mixed region by diffusion. With the inverted staggered type, a BSG film is used for compensation of the phosphorus. Boron is doped from the BSG film into a phosphorus/boron mixed region by diffusion.

In the above description, a hydrogenated amorphous silicon film is used as a thin-film semiconductor. However, any other amorphous or crystalline silicon film or any other semiconductor film may be used.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A thin-film transistor comprising:

a substrate;

a layered structure formed on said substrate;

said layered structure including a semiconductor film having a first subfilm located on one side of said semiconductor film and a second subfilm located on the other side thereof;

said first subfilm forming an electrically conductive channel of said transistor;

said second subfilm having a high-resistance part with a high electric resistance, a source contact region connected to one end of said high-resistance part, and a drain contact region connected to the other end of said high-resistance part;

said high-resistance part being located in a back channel section of said electrically conductive channel and containing an n-type impurity and a p-type impurity;

a gate insulating film formed to be contacted and overlapped with the first subfilm of said semiconductor film;

a gate electrode formed to be overlapped with said gate insulating film;

a source electrode formed to be contacted with and electrically connected to said source contact region of said second subfilm of said semiconductor film and electrically isolated from said high-resistance part; and a drain electrode formed to be contacted with and electrically connected to said drain contact region of said second subfilm of said semiconductor film and electrically isolated from said high-resistance part;

wherein said high-resistance part located in said back channel section serves to suppress a leakage current flowing between said source electrode and said drain electrode;

wherein said semiconductor film is made of an undoped semiconductor material;

and wherein said semiconductor film has a pair of n-type regions contacted with said source and drain electrodes, respectively, and wherein said high-resistance part of said back channel section is located on a same side of said semiconductor film as that of said pair of n-type regions;

said layered structure further comprising an additional film containing a p-type impurity contacted with said back channel section of said semiconductor film.

2. A thin-film transistor comprising:

a substrate;

a layered structure formed on said substrate;

said layered structure including a semiconductor film having a first subfilm located on one side of said semiconductor film and a second subfilm located on the other side thereof;

said first subfilm forming an electrically conductive channel of said transistor;

said second subfilm having a high-resistance part with a high electric resistance, a source contact region connected to one end of said high-resistance part, and a drain contact region connected to the other end of said high-resistance part;

said high-resistance part being located in a back channel section of said electrically conductive channel and containing an n-type impurity and a p-type impurity;

a gate insulating film formed to be contacted and overlapped with the first subfilm of said semiconductor film;

a gate electrode formed to be overlapped with said gate insulating film;

a source electrode formed to be contacted with and electrically connected to said source contact region of said second subfilm of said semiconductor film and electrically isolated from said high-resistance part, and wherein the second subfilm has a thickness in a range between 3 nm and 20 nm.

3. The thin film transistor according to claim 2, wherein the first subfilm has a thickness in a range between 20 nm and 70 nm.

4. A transistor as claimed in claim 2, wherein said semiconductor film is made of an undoped semiconductor material;

and wherein said semiconductor film has a pair of n-type regions contacted with said source and drain electrodes, respectively;

and wherein said high-resistance part of said back channel section is located on a same side of said semiconductor film as that of said pair of n-type regions.

5. A thin-film transistor comprising:

a substrate;

a layered structure formed on said substrate;

said layered structure including a semiconductor film having a first subfilm located on one side of said semiconductor film and a second subfilm located on the other side thereof;

said first subfilm forming an electrically conductive channel of said transistor;

said second subfilm having a high-resistance part with a high electric resistance, a source contact region connected to one end of said high-resistance part, and a drain contact region connected to the other end of said high-resistance part;

said high-resistance part being located in a back channel section of said electrically conductive channel and containing an n-type impurity and a p-type impurity;

a gate insulating film formed to be contacted and overlapped with the first subfilm of said semiconductor film;

a gate electrode formed to be overlapped with said gate insulating film;

a source electrode formed to be contacted with and electrically connected to said source contact region of said second subfilm of said semiconductor film;

a drain electrode formed to be contacted with and electrically connected to said drain contact region of said second subfilm of said semiconductor film, wherein said second subfilm has one of an n-type and a p-type conductivity, and further comprising a semiconductor contact layer having an opposite conductivity type from said second subfilm which is disposed in physical contact in a layered relationship with said high resistance part.

6. The thin film transistor according to claim 5 further comprising a pixel electrode in electrical contact with said source electrode.

7. The thin film transistor according to claim 6, wherein said second subfilm has a thickness in a range between 3 nm and 20 nm.

8. The thin film transistor according to claim 7, wherein said first subfilm has a thickness in a range between 20 nm and 70 nm.

* * * * *

UNITED STATES PATENT AND TRADEMARK OFFICE
CERTIFICATE OF CORRECTION

PATENT NO.     : 6,285,041 B1
DATED          : September 4, 2001
INVENTOR(S)    : Kesao Noguchi Page 1 of 1

It is certified that error appears in the above-identified patent and that said Letters Patent is hereby corrected as shown below:

Column 12,
Line 7, delete "film" insert -- film 229. --

Column 16,
Line 31, delete "silioon" insert -- silicon --

Column 22,
Line 59, delete "216" insert -- 218 --

Signed and Sealed this

Twenty-first Day of May, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

| | | |
|---|---|---|
| PATENT NO. | : 6,285,041 B1 | Page 1 of 1 |
| APPLICATION NO. | : 08/921044 | |
| DATED | : September 4, 2001 | |
| INVENTOR(S) | : Kesao Noguchi | |

It is certified that error appears in the above-identified patent and that said Letters Patent is hereby corrected as shown below:

IN THE TITLE at (54) and above paragraph 1, column 1: should read as follows:

THIN-FILM TRANSISTOR HAVING A HIGH RESISTANCE BACK CHANNEL REGION AND FABRICATION METHOD THEREOF

Signed and Sealed this

Twenty-eighth Day of June, 2011

David J. Kappos
*Director of the United States Patent and Trademark Office*